US012580156B2

(12) United States Patent
Van Zyl

(10) Patent No.:   US 12,580,156 B2
(45) Date of Patent:       Mar. 17, 2026

(54) SOLID-STATE MATCH (SSM)-GENERATOR SYNCHRONIZATION

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 400 days.

(21) Appl. No.: 18/097,909

(22) Filed: Jan. 17, 2023

(65) Prior Publication Data

US 2023/0230808 A1      Jul. 20, 2023

Related U.S. Application Data

(60) Provisional application No. 63/300,100, filed on Jan. 17, 2022.

(51) Int. Cl.
*H01J 37/32* (2006.01)
(52) U.S. Cl.
CPC .. *H01J 37/32183* (2013.01); *H01J 37/32935* (2013.01); *H01J 37/3299* (2013.01)
(58) Field of Classification Search
None
See application file for complete search history.

(56) References Cited

U.S. PATENT DOCUMENTS

| | | | |
|---|---|---|---|
| 10,622,972 B2 | 4/2020 | Crandell | |
| 2004/0041671 A1 | 3/2004 | Van Rumpt | |
| 2004/0163594 A1 | 8/2004 | Windhorn | |
| 2013/0207738 A1 | 8/2013 | Mason | |
| 2015/0180426 A1 | 6/2015 | Kingsley | |
| 2015/0349750 A1 | 12/2015 | Van Zyl | |
| 2019/0006995 A1 | 1/2019 | Jurkov et al. | |
| 2019/0020313 A1* | 1/2019 | Perreault | H03F 3/245 |
| 2020/0350863 A1 | 11/2020 | Jurkov et al. | |
| 2020/0411289 A1 | 12/2020 | Radomski et al. | |

OTHER PUBLICATIONS

PCT, International preliminary report on patentability issued in PCT/US2023/010945, Aug. 2, 2024, 14 pages.
PCT, International search report and written opinion issued in PCT/US2023/010945, Apr. 25, 2023, 19 pages.

* cited by examiner

*Primary Examiner* — Crystal L Hammond
(74) *Attorney, Agent, or Firm* — NOD Law PC

(57) ABSTRACT

This disclosure describes systems, methods, and apparatuses for a power system comprising a generator connected to a solid-state match network and a synchronization module connected to the generator and the solid-state match network, wherein the synchronization module is configured to synchronize a power delivered by the generator to the match network with the opening and closing of switches in the solid-state matching network.

12 Claims, 23 Drawing Sheets

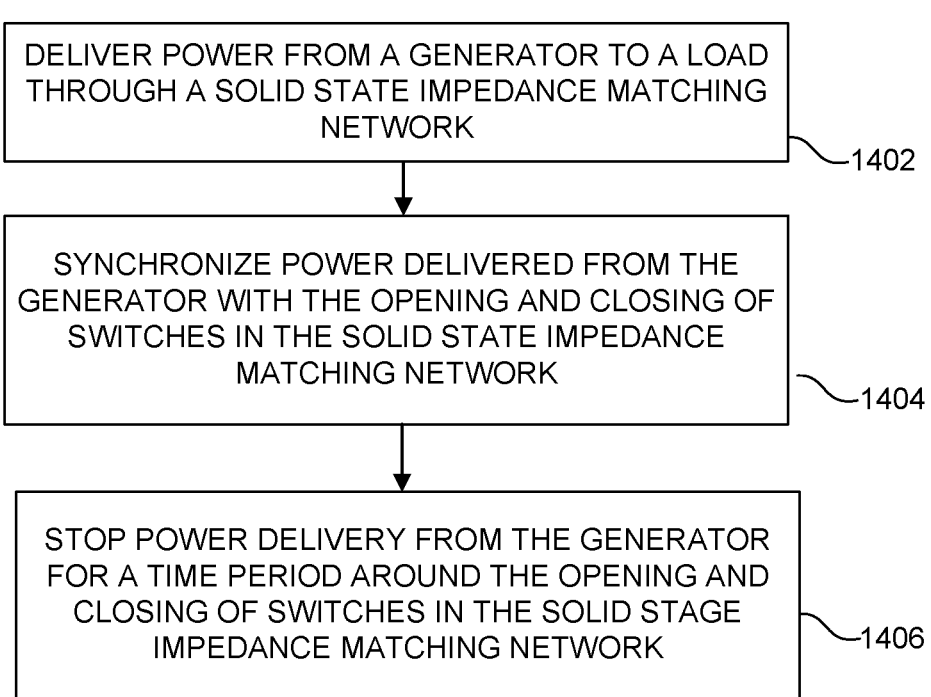

DELIVER POWER FROM A GENERATOR TO A LOAD THROUGH A SOLID STATE IMPEDANCE MATCHING NETWORK

—1402

SYNCHRONIZE POWER DELIVERED FROM THE GENERATOR WITH THE OPENING AND CLOSING OF SWITCHES IN THE SOLID STATE IMPEDANCE MATCHING NETWORK

—1404

STOP POWER DELIVERY FROM THE GENERATOR FOR A TIME PERIOD AROUND THE OPENING AND CLOSING OF SWITCHES IN THE SOLID STAGE IMPEDANCE MATCHING NETWORK

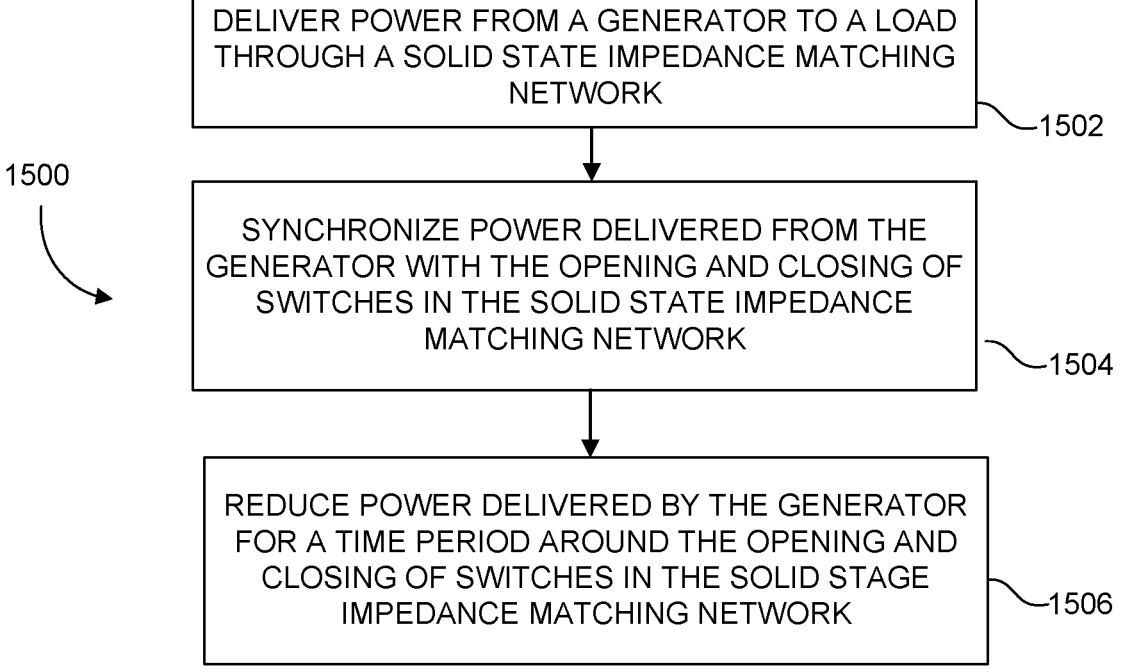

1500

DELIVER POWER FROM A GENERATOR TO A LOAD
THROUGH A SOLID STATE IMPEDANCE MATCHING
NETWORK
1502

SYNCHRONIZE POWER DELIVERED FROM THE
GENERATOR WITH THE OPENING AND CLOSING OF
SWITCHES IN THE SOLID STATE IMPEDANCE
MATCHING NETWORK
1504

REDUCE POWER DELIVERED BY THE GENERATOR
FOR A TIME PERIOD AROUND THE OPENING AND
CLOSING OF SWITCHES IN THE SOLID STAGE
IMPEDANCE MATCHING NETWORK
1506

FIG. 15

SOLID-STATE MATCH (SSM)-GENERATOR SYNCHRONIZATION

CLAIM OF PRIORITY UNDER 35 U.S.C. § 119

The present Application for Patent claims priority to Provisional Application No. 63/300,100 entitled "SOLID-STATE MATCH (SSM)-GENERATOR SYNCHRONIZATION" filed Jan. 17, 2022, and assigned to the assignee hereof and hereby expressly incorporated by reference herein.

FIELD OF THE DISCLOSURE

The present disclosure relates generally to power systems. Specifically, but without limitation, the present disclosure relates to impedance matching networks.

DESCRIPTION OF RELATED ART

In the context of plasma processing, manufacturers use plasma processing chambers that utilize power (e.g., radio frequency (RF) power) to generate a plasma. In order to achieve efficient power transfer between a generator and a plasma load, an impedance-matching network ("match network") is often used to match the load impedance to a desired input impedance, typically (although not always) 50 ohms. Plasma load impedance may vary depending on variables such as generator frequency, power, chamber pressure, gas composition, and plasma ignition. The match network accounts for these variations in load impedance by varying reactive elements (e.g., variable capacitors) to maintain the desired input impedance.

RF matching networks have long utilized variable vacuum capacitors, but solid-state matches (SSMs), which include discrete capacitors that are switched in or out to alter the value of a capacitor in a SSM, are now an alternative technology that are gaining popularity because SSMs can be switched more quickly, and faster switching enables faster matching, which enables better process control.

As is known in the art, PIN diodes may be used to switch reactive elements (e.g., capacitors and inductors) in and out of solid-state matches. A PIN diode is an electrical diode device with an un-doped or lightly doped intrinsic (I) semiconductor region sandwiched between a heavily doped p-type semiconductor region (P) and a heavily doped n-type semiconductor region (N); hence, the "PIN diode" designation. In general, PIN diodes obey conventional diode behavior at low frequency input signals, but at higher input signal frequencies, operate as a resistor in the forward biased or ON state and as a small capacitor in the reverse biased or OFF state.

Fast PIN diode drivers with energy recovery beneficially allow for switching PIN diodes at high repetition rates such as 10 kHz. But for short periods of time (~2 us) while the PIN diode is transitioning between the ON and OFF states, dissipation due to high applied RF voltages and currents can be high. High dissipation may reduce the overall reliability of the system. Thus, there is a need for a refined power system that reduces these short periods of high dissipation.

The description provided in the description of related art section should not be assumed to be prior art merely because it is mentioned in or associated with this section. The description of related art section may include information that describes one or more aspects of the subject technology.

SUMMARY OF THE DISCLOSURE

The following presents a simplified summary relating to one or more aspects and/or embodiments disclosed herein.

As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Aspects of the present disclosure generally relate to systems, methods, and apparatuses for solid state match circuits, and more particularly for synchronizing power delivery from a generator with the on to off and off to on transitions of switches (e.g., PIN diodes) in a solid-state match to which the generator is connected.

Due to the high dissipation in the transition, substantially less of the power provided by the generator reaches the load. By reducing RF power (or even completely shutting off RF power) for the short time period while the switches (e.g., PIN diodes) are transitioning between states, dissipation in the switches is substantially reduced with little impact on the load because the load would at any rate not have received all the power the generator is delivering due to the high dissipation in the switches.

Reducing the periods of peak power dissipation allows for persistent switching at high repetition rates. Without this reduction in power, the average dissipation in the switches becomes a limiting factor to how high a repetition rate can be sustained.

In some aspects, the techniques described herein relate to a power delivery system, including: a solid-state match (SSM) network having a load side and a source side and one or more switches therebetween; a generator connected to the source side of the SSM network; a plurality of control sources for controlling a power delivered by the generator to the SSM network, wherein the plurality of control sources includes at least a first control source configured to output a first control signal and a second control source configured to output a second control signal; a synchronization module connected to the generator and the SSM network, wherein the synchronization module is configured to: obtain timing information from the SSM network, wherein the timing information includes information pertaining to time periods when the one or more switches of the SSM network change state from an open state to a close state, or vice-versa; and synchronize, based at least in part on the timing information, the power delivered by the generator to the SSM network, wherein the synchronizing includes: selecting one of the first control source and the second control source to connect to the generator; and one of pausing, reducing, resuming, or increasing the power delivered by the generator to the SSM network at or around the time periods when one or more switches of the SSM network change state.

In some aspects, the techniques described herein relate to a power delivery system, wherein the generator includes the first control source, and wherein the synchronization module includes the second control source for amplitude control.

In some aspects, the techniques described herein relate to a power delivery system, wherein, when the second control source is connected to the generator, the synchronization module is configured to pause the power delivered by the generator to the SSM network for a time period around when the one or more switches of the SSM network change state.

In some aspects, the techniques described herein relate to a power delivery system, wherein, when the second control source is connected to the generator, the synchronization module is configured to reduce the power delivered by the generator to the SSM network for a time period around when the one or more switches of the SSM network change state.

In some aspects, the techniques described herein relate to a power delivery system, wherein the synchronization module is further configured to: estimate a temperature of at least one device in the SSM network; compare the temperature to a threshold; and when the temperature is above the threshold, transmit an indication to the generator to pause power delivery to the SSM match network for at least one time period at or around when the one or more switches of the SSM network change state.

In some aspects, the techniques described herein relate to a power delivery system, wherein the synchronization module is further configured to transmit another indication to the generator to resume power delivery to the SSM network for at least one time period at or around when the one or more switches of the SSM network change state, based at least in part on detecting the temperature is below the threshold.

In some aspects, the techniques described herein relate to a power delivery system, wherein the synchronization module is further configured to: estimate a temperature of at least one device in the SSM network; compare the temperature to a threshold; and when the temperature is above the threshold, transmit an indication to the generator to reduce power delivery to the SSM match network for at least one time period at or around when the one or more switches of the SSM network change state.

In some aspects, the techniques described herein relate to a power delivery system, wherein the synchronization module is further configured to transmit another indication to the generator to increase power delivery to the SSM network for at least one time period at or around when the one or more switches of the SSM network change state, based at least in part on detecting the temperature is below the threshold.

In some aspects, the techniques described herein relate to a power delivery system, further including a plasma load connected to the SSM network.

In some aspects, the techniques described herein relate to a power delivery system, wherein the generator includes the first control source, and wherein the synchronization module includes the second control source for amplitude control and a third control source for timing control, and wherein the third control source adjusts a timing for connecting one of the first control source and the second control source to a power amplifier of the generator, and disconnecting another of the first control source and the second control source from the power amplifier.

In some aspects, the techniques described herein relate to a synchronization module, including: one or more hardware processors configured by machine-readable instructions to: identify a first control source, wherein the first control source outputs at least one first control signal; identify a second control source, wherein the second control source outputs at least one second control signal; obtain timing information from a solid-state match network, wherein the solid-state match network includes one or more switches, and wherein the timing information includes information pertaining to time periods when the one or more switches change state; determine, based at least in part on the timing information, two or more of: a first time period where the first control source is active; a second time period where the second control source is active; and a time for switching from the first to the second control source or vice-versa.

In some aspects, the techniques described herein relate to a synchronization module, wherein the one or more hardware processors are further configured by machine-readable instructions to: receive feedback information related to data measured during one or more of the first time period and the second time period; and adjust, based at least in part on the feedback information, one or more of the at least one first control signal and the at least one second control signal.

In some aspects, the techniques described herein relate to a synchronization module, wherein the synchronization module is electronically, logically, or communicatively coupled to a generator and the solid-state match network, the generator including: a power amplifier, the power amplifier configured to receive the at least one first control signal from the first control source and the at least one second control signal from the second control source; and at least one switch.

In some aspects, the techniques described herein relate to a synchronization module, wherein the one or more hardware processors are further configured by machine-readable instructions to: control the at least one switch in the generator, wherein controlling the at least one switch in the generator includes: coupling the power amplifier to the first control source during the first time period; transitioning control of the power amplifier from the first control source to the second control source; and coupling the power amplifier to the second control source during the second time period.

In some aspects, the techniques described herein relate to a synchronization module, wherein the one or more hardware processors are further configured by machine-readable instructions to: transmit an indication to the power amplifier to one of pause, reduce, or increase power output for each of the one or more time periods when the one or more switches of the solid-state match network change state, and wherein the indication is received via one of the first control signal and the second control signal.

In some aspects, the techniques described herein relate to a synchronization module, wherein the one or more hardware processors are further configured by machine-readable instructions to: receive feedback information related to a power level measured during at least one duration when the power output from the power amplifier is paused, reduced, or increased; and adjust, based at least in part on the feedback information, one or more of the at least one first control signal, the at least one second control signal, the first time period, and the second time period.

In some aspects, the techniques described herein relate to a non-transitory, tangible computer readable storage medium, encoded with processor readable instructions to perform a method for operating a power delivery system, the method including: identifying a first control source, wherein the first control source outputs at least one first control signal; identifying a second control source, wherein the second control source outputs at least one second control signal; obtaining timing information from a solid-state match network, wherein the solid-state match network includes one or more switches, and wherein the timing information includes information pertaining to time periods when the one or more switches change state from an open state to a close state, or vice-versa; determining, based at least in part on the timing information, two or more of: a first time period where the first control source is active; a second time period where the second control source is active; and a time for switching from the first to the second control source or vice versa.

In some aspects, the techniques described herein relate to a non-transitory, tangible computer readable storage medium, wherein the solid-state match network is connected to a generator, the method further including: synchronizing, based at least in part on the timing information, power delivery by the generator to the solid-state match network, wherein the synchronizing includes: selecting one of the first control source and the second control source to connect to the generator; and one of pausing, reducing, resuming, or increasing the power delivered by the generator to the solid-state match network at or around the time periods when the one or more switches of the solid-state match network change state.

In some aspects, the techniques described herein relate to a non-transitory, tangible computer readable storage medium, wherein the method further includes receiving feedback information related to data measured during one or more of the first time period and the second time period; and adjusting, based at least in part on the feedback information, one or more of the at least one first control signal and the at least one second control signal.

In some aspects, the techniques described herein relate to a non-transitory, tangible computer readable storage medium, wherein the method further includes connecting the solid-state match network to a plasma load.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 9 illustrates waveforms in a power system, according to various aspects of the disclosure.

FIG. 14 illustrates an example of a method for operating a power system, according to various aspects of the disclosure.

FIG. 15 illustrates an example of a method for operating a power system, according to various aspects of the disclosure.

DETAILED DESCRIPTION

Prior to describing the embodiments in detail, it is expedient to define certain terms as used in this disclosure.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the functionality and operation of possible implementations of a power system comprising a generator connected to a solid-state match network according to various embodiments of the present disclosure. It should be noted that, in some alternative implementations, the functions noted in each block may occur out of the order noted in the figures. For example, two blocks shown in succession may, in fact, be executed substantially concurrently, or the blocks may sometimes be executed in the reverse order, depending upon the functionality involved. For instance, the operations of reducing power delivered by a generator for a time period around the opening and closing of switches in a solid stage impedance matching network when a temperature exceeds a threshold can be interchanged or performed concurrently with increasing power delivered by a generator for a time period around the opening and closing of switches in a solid stage impedance matching network when a temperature is below a threshold and the generator power is currently reduced.

Delivered power is often lost when switches in a solid-state match (SSM) change state. In a power delivery system comprising a generator, SSM, and a load, continuing normal power delivery during the brief periods of time when switches in a SSM change state may lead to unnecessary heating in the SSM that may limit the maximum rate at which a SSM can change state without sustaining damage. In addition, since a significant portion of the delivered power may not reach the load during these brief periods of time when switches in a SSM change state, continuing normal power delivery may be wasteful (i.e., power is wasted rather than delivered to the load). Since the amount of power lost in the switches may be difficult to estimate, continuing normal power delivery may result in an uncertain amount of energy being delivered to the load which may be detrimental to processes (e.g., semiconductor processing in a plasma chamber) where accurate power delivery may be required. Broadly, this disclosure describes systems, methods, apparatuses, and/or storage media for reducing, if not turning off, power delivery from a generator around the times when PIN diodes for switching components of a SSM change state, which not only helps reduce power dissipated in PIN diode switches but also helps increase a rate at which an SSM can change state.

Figure 1:
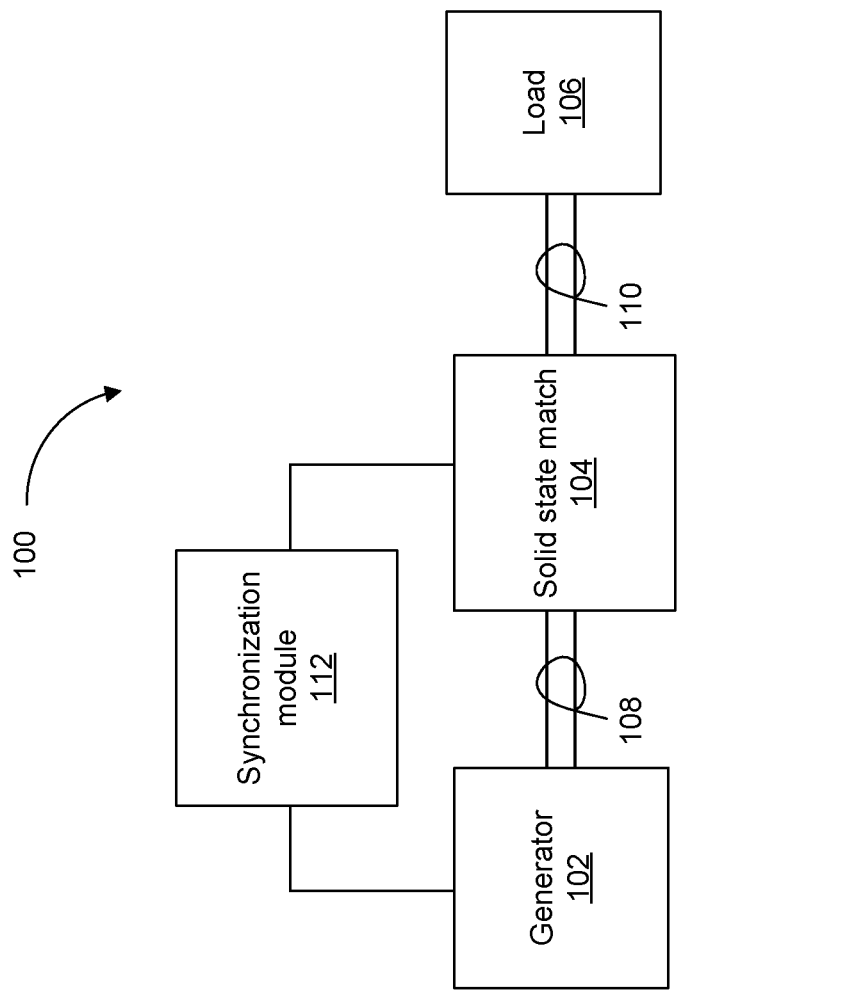
FIG. 1 is a block diagram illustrating a power system, according to various aspects of the disclosure.

FIG. 1 illustrates an example of a power system 100 adapted for synchronization control, according to various aspects of the disclosure. The power system 100 comprises a generator 102, a solid-state match (SSM) 104, a load 106, and a synchronization module 112. The synchronization module 112 may synchronize power delivery of the generator 102 with the operation of the SSM 104. In some examples, the load 106 may be a plasma load and the generator 102 may be a radio frequency (RF) generator. In some cases, the synchronization module may be implemented in the generator 102, or alternatively, in the SSM 104. In other cases, the synchronization module 112 may be implemented as a separate unit.

The generator 102 applies RF power to the match network 104 via a transmission line 108 (e.g., coaxial cable) and then onto the load 106 (e.g., a nonlinear load, such as a plasma load) via an electrical connection 110. The SSM 104 (also referred to as match network 104) varies its internal electrical elements (e.g., variable capacitors) such that the input impedance, $Z_{in}$, of the match network 104 is close to (i.e., within a threshold range, for instance $$\frac{|Z_{in} - Z_t|}{|Z_{in} + Z_t^*|} < 0.05$$

where $Z_t^*$ is the complex conjugate of $Z_t$) a target input impedance, $Z_t$ (e.g., 50Ω). Match networks typically contain reactance elements, meaning elements that store energy in electrical and magnetic fields as opposed to resistive elements that dissipate electrical power. The most common reactance elements are capacitors, inductors and coupled inductors but others such as distributed circuits are also used.

Figure 2:
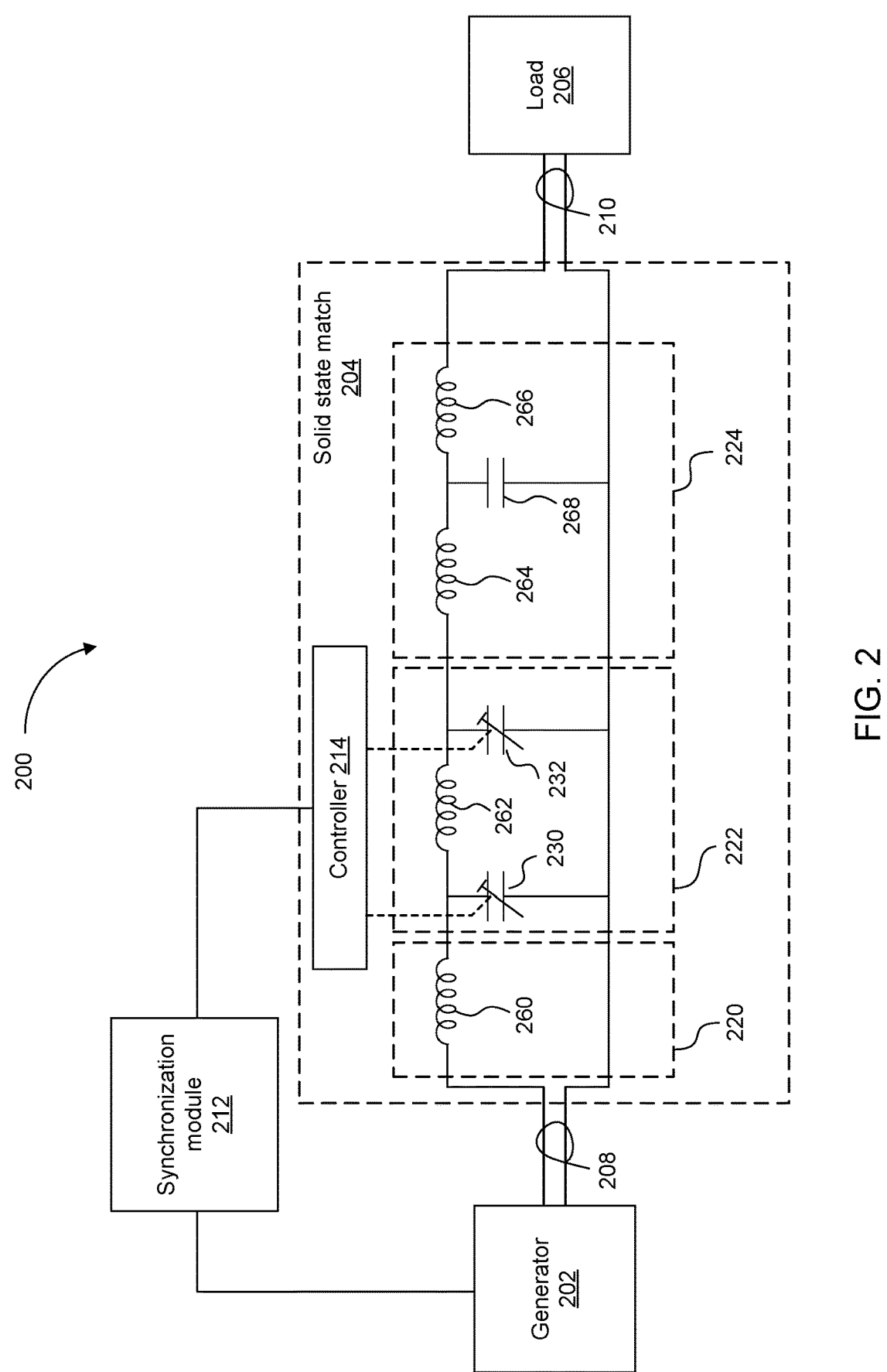
FIG. 2 is a block diagram illustrating a power system according to various aspects of the disclosure.

FIG. 2 illustrates a diagram of a power system 200 adapted for synchronization control, in accordance with various aspects of the disclosure. Power system 200 implements one or more aspects of the other power system(s) described herein, including at least power system 100 described in relation to FIG. 1. Power system 200 may comprise a generator 202, a solid-state match 204, a load 206, and a synchronization module 212. Some solid-state match networks 204 include two or more variable reactance elements, such as the variable capacitors 230 and 232 shown in FIG. 2. In some examples, one or more of the variable capacitors 230 and 232 may include a plurality of switched capacitors. For example, one or more of the variable capacitors 230, 232 can include a plurality of fractional and full-valued capacitors that can be switched in and out a respective one of the variable capacitors 230 and 232. By switching combinations of the fractional and full-valued capacitors into the variable capacitor, capacitances between a minimum and a maximum capacitance can be achieved, thereby varying the capacitance of the variable capacitor.

While two variable capacitors 230 and 232 are shown in FIG. 2, this is not intended to be limiting. For instance, in some embodiments, a single variable capacitor, or three or more variable capacitors may be utilized in the power system 200. One or more inductors may also be arranged before (e.g., inductor 260 positioned towards the generator or source side) or between (e.g., inductor 262) the variable capacitors, where the illustrated configuration is just one of many implementations. A variable reactance section 222, including the variable capacitors 230, 232 can be arranged with fixed reactance sections 220 and 224. In this example, the fixed reactance section 220 comprises the inductor 220, while the fixed reactance section 224 comprises two inductors 264, 266 and a capacitor 269 arranged in a T configuration. It should be noted that, other variations of the fixed reaction sections 220, 224 are also contemplated, for instance, using different number of inductors and/or capacitors, different configurations (e.g., Pi configuration instead of T configuration), or a combination thereof. Together, the fixed and variable reactance sections 220, 222, and 224 make up the match network 204.

In some embodiments, solid state match (SSM) 204 also includes a first control source (e.g., controller 214) for controlling the variable reactance elements 230 and 232, though in some embodiments the controller 214 can be remote from the SSM (e.g., part of the synchronization module 212). Controller 214 may be in communication with a synchronization module 212 that synchronizes power delivery of the generator 202 with operation of the SSM 204. In some examples, the synchronization module 212 may comprise one or more additional control sources (e.g., second control source, shown as amplitude control module 1030 in FIG. 10; third control source, shown as timing control module 1032 in FIG. 10)

Figure 3A:
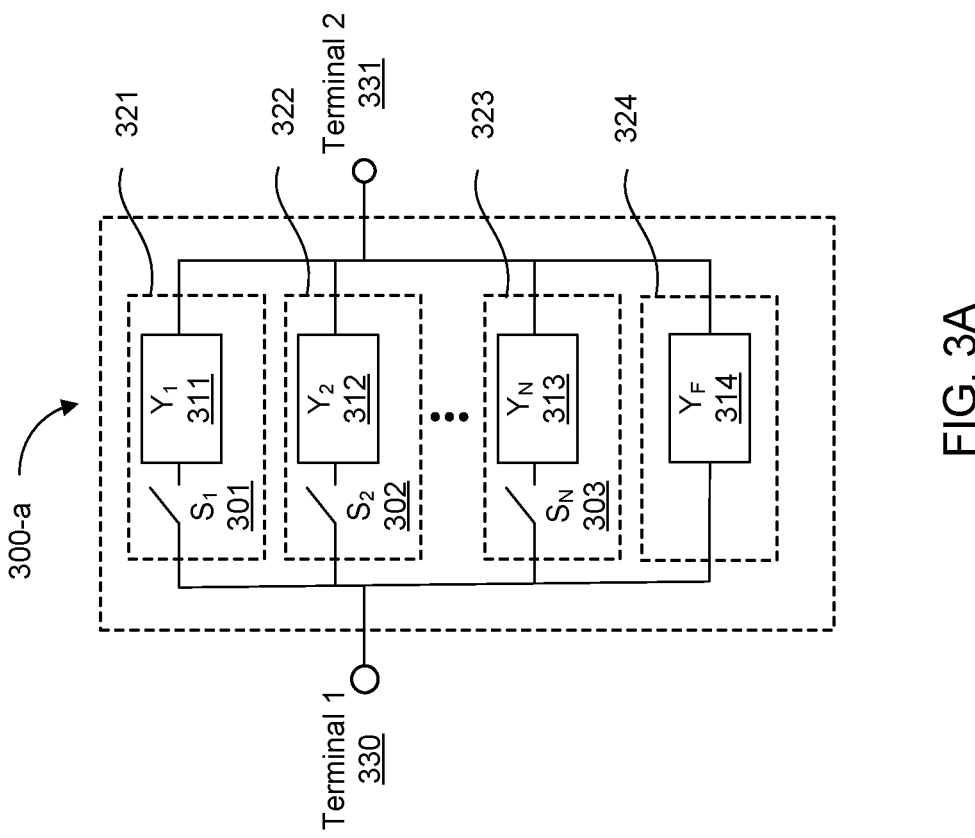
FIG. 3A is a block diagram illustrating a switched variable reactance element, according to various aspects of the disclosure.

FIG. 3A illustrates a block diagram 300-a of a switched variable reactance element (e.g., switched variable capacitor 230 and/or 232 of FIG. 2) that may be used in the design of an impedance matching network (e.g., solid-state match 204 of FIG. 2), according to various aspects of the disclosure. Variable reactance element 300-a comprises a first terminal 330, a second terminal 331, a plurality of reactances (e.g., reactance 311, reactance 312, reactance 313, reactance 314), and a plurality of switches (e.g., switch 301, switch 302, switch 303). In variable reactance element 300-a, each of reactances $Y_1, Y_2, \ldots Y_N$ are in series with a respective one of switches $S_1, S_2, \ldots, S_N$. Closing the switch in series with a reactance (e.g., switch $S_2$ in series with reactance $Y_2$) adds the susceptance of that reactance to the total susceptance of the variable reactance element (e.g., variable reactance element 300-a). The variable reactance element 300-a can also contain one or more fixed reactances 314 that are not arranged in series with a switch.

Figure 3B:
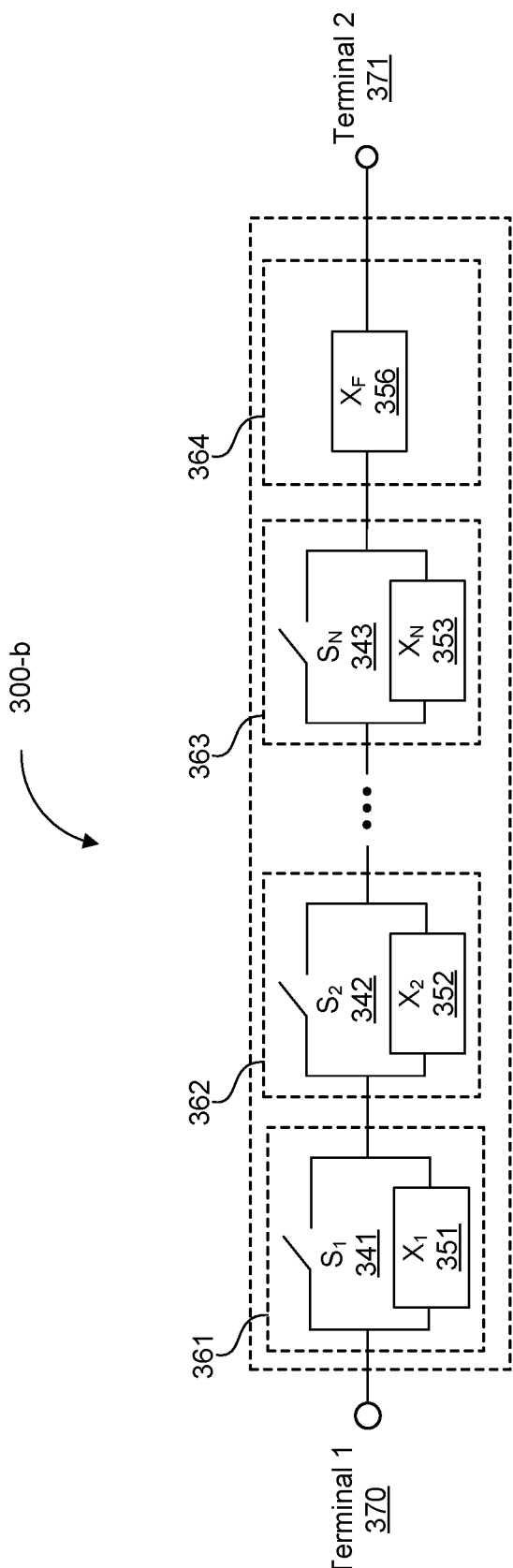
FIG. 3B is a block diagram illustrating a switched variable reactance element according to various aspects of the disclosure.

FIG. 3B illustrates a block diagram 300-b of a switched variable reactance element (e.g., switched variable capacitor 230 and/or 232 of FIG. 2) that may be used in the design of an impedance matching network (e.g., solid-state match 204 of FIG. 2), according to various aspects of the disclosure. The variable reactance element shown in FIG. 3B comprises a first terminal 370, a second terminal 371, a plurality of reactances (e.g., reactances 351 through 353, reactance 356), and a plurality of switches (e.g., switches 341 through 343). In variable reactance element 300-b, reactances $X_1, X_2, \ldots$ $X_N$ are shunted by (in parallel with) switches $S_1, S_2, \ldots, S_N$. Here, each of the reactances $X_1, X_2, \ldots, X_N$ are in parallel with a respective one of switches $S_1, S_2, \ldots, S_N$. Opening the switch shunting a reactance (e.g., switch $S_1$ shunting reactance $X_1$) adds the reactance of that reactance to the total reactance of the variable reactance element 300-b. The variable reactance element can also contain one or more fixed reactances 356 that are not shunted by a switch.

PIN diodes are electrical devices having an un-doped or lightly doped intrinsic (I) semiconductor region sandwiched between heavily doped regions, and have various applications, for instance, as switching devices in impedance matching networks, especially in radio frequency (RF) matching networks. The "PIN" designation derives from the three-part "sandwich" structure of this diode: a lightly doped intrinsic region (I) positioned between a heavily doped p-type semiconductor (P) and a heavily doped n-type semiconductor (N).

In general, PIN diodes obey conventional diode behavior at low frequency input signals, but for higher frequency input signals they operate as a resistor in the forward biased or ON-state, and as a capacitor in the reverse biased or OFF-state. As such, PIN diodes are often utilized in radio frequency (RF) applications, e.g., in attenuators and fast switches where high isolation and low loss are needed. In some circumstances, PIN diodes can be turned ON with a DC current that is a small fraction of the RF current being switched and turned OFF by reverse biasing the PIN diode. PIN diodes are attractive switches because they combine low ON-state resistance with very low OFF-state losses. In some cases, a PIN diode driver circuit may be used to turn the PIN diode ON and OFF by conducting a DC current through the PIN diode and applying a reverse bias voltage across the PIN diode, respectively.

In one implementation, PIN diodes are used in an impedance match network configured to match a varying load impedance of a plasma load to a target impedance (e.g., 50 ohm) into which a high-power RF generator can deliver power. In such an implementation, the PIN diodes serve to connect or disconnect reactive components, such as capacitors and/or inductors, of the impedance matching network to quickly alter the properties of the matching network by switching the reactive elements in and out of the network.

Figure 4:
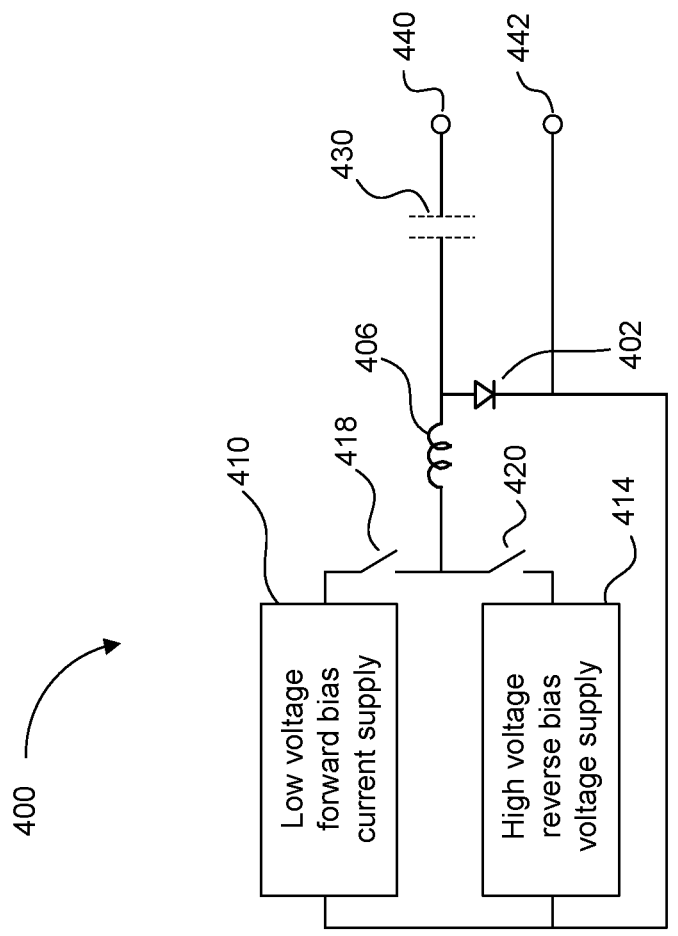
FIG. 4 is a block diagram illustrating a PIN diode switch according to various aspects of the disclosure.

FIG. 4 illustrates a block diagram 400 of a PIN diode switch, according to various aspects of the disclosure. In some embodiments, PIN diode switch 400 may be used to realize any of the switches $S_1, S_2, \ldots, S_N$, of variable reactance element 300-a in FIG. 3A and/or switches $S_1, S_2, \ldots, S_N$, of variable reactance element 300-b in FIG. 3B. As noted above, one or more of the variable reactance elements 300-a and 300-b may be used in the design of an impedance matching network (e.g., solid-state match 204 of FIG. 2).

If a DC current path exists through the network connected between the switch terminals 440 and 442, optional capacitor 430 may be desirable. In many applications, a DC path may not exist (e.g., when the switch is in series with a capacitor as is often the case for switched variable capacitor elements) and the optional capacitor 430 may not be needed. To turn the switch ON (i.e., create a low magnitude impedance between terminals 440 and 442), a DC current is conducted through PIN diode 402. This may be accomplished by closing switch 418 (with switch 420 open), where the switch 418 is coupled in series with low voltage forward bias current supply 410. Conducting a small (e.g., 700 mA) current through PIN diode 402 causes PIN diode 402 to act like a small (e.g., 0.15Ω) resistor to RF current, thereby presenting a low RF impedance between switch terminals 440 and 442. To turn the switch OFF (i.e., create a large magnitude impedance between terminals 440 and 442), a reverse bias voltage is applied across PIN diode 402. This may be accomplished by closing switch 420 (with switch 418 open), where the switch 420 is coupled in series with high voltage reverse bias voltage supply 414. Reverse biasing PIN diode 402 causes PIN diode 402 to act as a small (e.g., 4 pF) capacitor to RF current. The magnitude of the applied reverse bias voltage may be larger than the largest RF voltage that may be applied between terminals 440 and 442. A typical reverse bias voltage may be 1500 V.

Figure 5B:
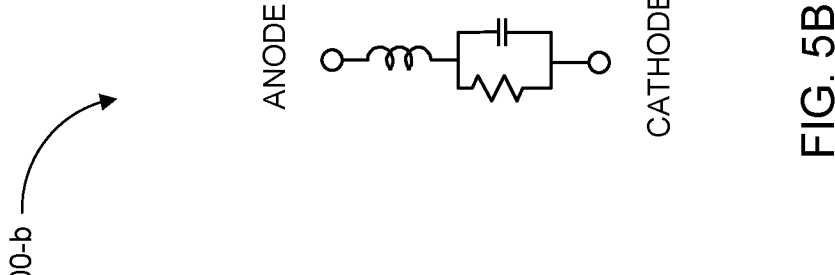
FIG. 5B illustrates a schematic diagram of an equivalent circuit for a PIN diode in the OFF state, according to various aspects of the disclosure.
Figure 5A:
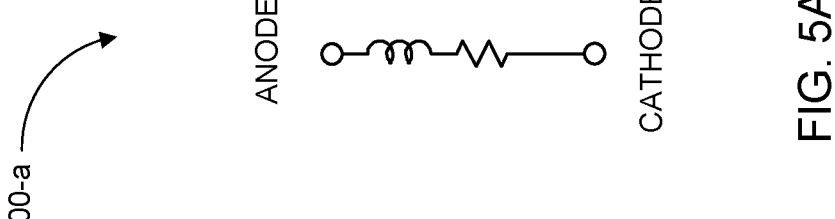
FIG. 5A illustrates a schematic diagram of an equivalent circuit for a PIN diode in the ON state, according to various aspects of the disclosure.

An equivalent forward biased ("ON") circuit 500-a for a PIN diode, such as PIN diode 402, that may be used as a switch in the design of a variable reactance element, is illustrated in FIG. 5A. A typical value for the resistor in FIG. 5A is 0.15Ω and a typical value for the inductor in FIG. 5A is 1 nH, although other resistance and inductance values are contemplated in different embodiments. PIN diodes are often used as switches in variable reactance elements because they act like a small (e.g., 0.15Ω) resistor for RF current in the ON state and as a small capacitor (e.g., 4 pF) in the OFF state.

An equivalent reverse biased ("OFF") circuit 500-b for a PIN diode, such as PIN diode 402, is illustrated in FIG. 5B. The equivalent circuit includes an inductor in series with a parallel combination of a resistor and a capacitor. A typical value for the inductance in FIG. 5B is 1 nH, a typical value for the capacitor is 4 pF, and a typical value for the resistor is 1.6 MΩ.

Figure 6:
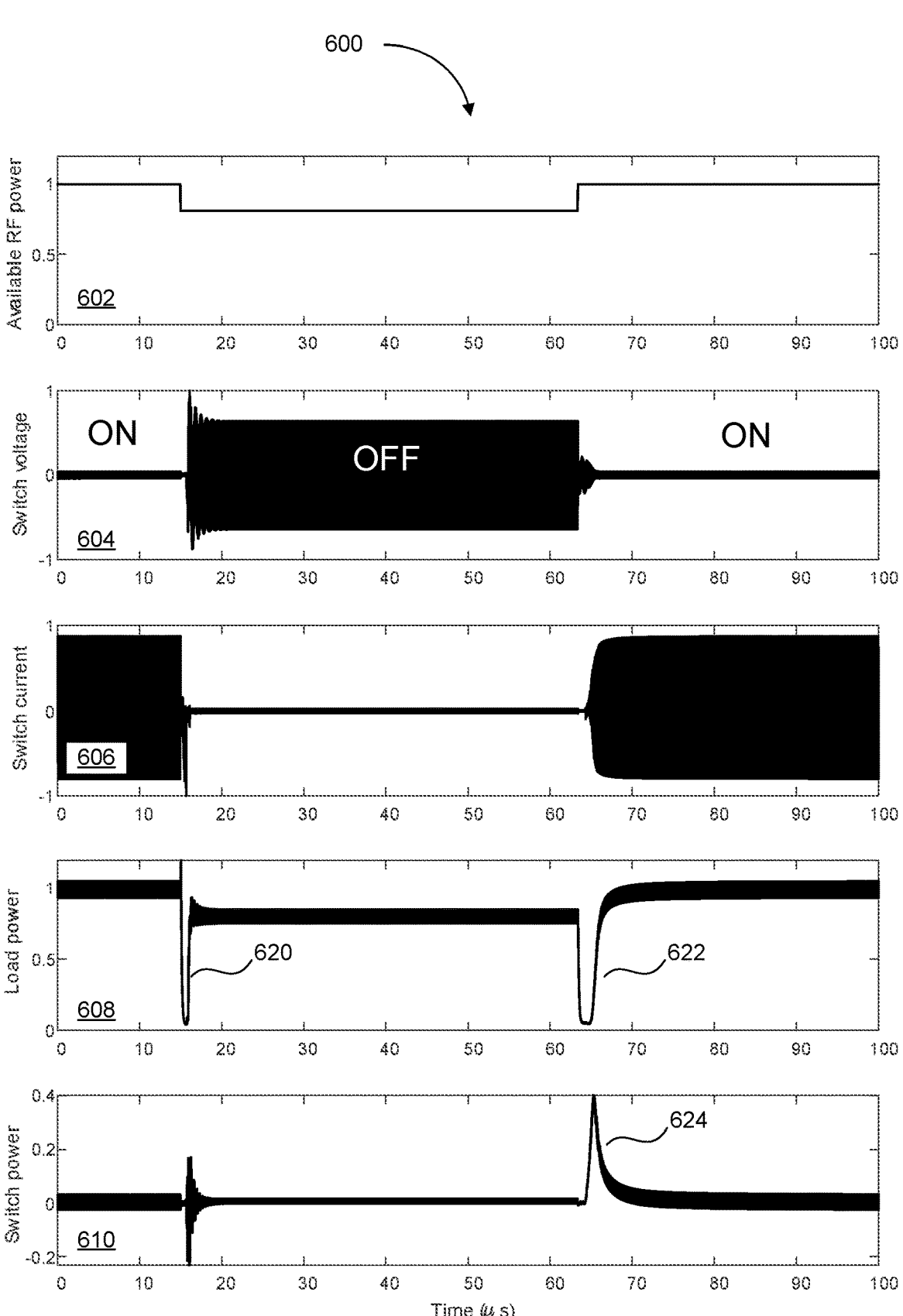
FIG. 6 illustrates waveforms in a power system, according to various aspects of the disclosure.

FIG. 6 illustrates example waveforms 600 in a traditional power delivery system where power delivery is uninterrupted during switching. The top plot 602 shows normalized available power from a generator (e.g., generator 102 of FIG. 1) as a function of time. In a typical application, a normalized power of 1 may correspond to 3 kW, for example. Plot 602 shows that at 15 microseconds the normalized generator available power decreases—changing from 1 to 0.81. The two normalized powers shown (1 and 0.81) may represent two different states where the generator may have a different power setpoint and output a different frequency in the two different states. In some circumstances, the traditional power delivery system may alternate between the two different states at e.g., a 10 kHz rate. Available power is also called forward power and real delivered power (i.e., power that can be converted to an equivalent amount of heat) is the available power minus reflected power. Generators typically operate in either forward or delivered power mode, but since generator control systems are typically not fast enough to respond to changes in load impedance that happen on a scale of microseconds, a typical generator may only be able to keep available power approximately constant, even if it is trying to keep delivered power constant.

The second from the top plot 604 shows the voltage over a switch of a variable reactance element in a matching network, where the matching network is connected between the generator and a load. As shown in plot 604, between 0 and 15 microseconds and again between 65 and 100 microseconds, voltage over the switch is low. Additionally, and as shown in plot 606, current through the switch is high during the internals from 0-15 microseconds and 65-100 microseconds, meaning the switch is closed or ON. Between 15 and 65 microseconds, voltage over the switch is high (as shown in plot 604) and current through the switch is low (as shown in plot 606), meaning that the switch is open or OFF. Both voltage (e.g., switch voltage in plot 604) and current (e.g., switch current in plot 606) are normalized. For example, a value of 1 in the voltage plot 604 may correspond to voltage of around 1000 V, while a value of 1 in the current plot 606 may correspond to a current of around 15 A. The largest contribution to both the voltage of plot 604 and current of plot 606 is RF voltage and current (i.e., as opposed to DC voltage and current). A typical frequency of the RF voltage and current may be 13.56 MHz.

The second from bottom plot 608 shows the fraction of the available power from the generator (e.g., generator 102 of FIG. 1) that is delivered to the load (e.g., load 106 of FIG. 1), herein referred to as load power. As illustrated in plot 608, there are two drops 620 and 622 in the load power at around 15 microseconds and around 65 microseconds, respectively. The drops 620, 622 may be partly due to shifts in the load impedance causing reflected power to increase and delivered power to drop, but some of this power is also dissipated in the switches (e.g., switches $S_1$, $S_2$, . . . , $S_N$) of variable reactance elements (e.g., variable reactance element 300-*a* of FIG. 3A). In some instances, the variable reactance elements may be used as variable reactance elements (e.g., variable capacitors 230 and 232 of solid state match 204 of FIG. 2) in a solid state match (e.g., match 204 of FIG. 2) of a power delivery system (e.g., power delivery system 200 of FIG. 2).

Plots 608 and 610 of FIG. 6 show that when the switches in the solid-state match (e.g., SSM 204 of FIG. 2) are switched, power delivery to the load is reduced as depicted by the dips 620 and 622 and power is dissipated in the switches of the variable reactance elements of the solid-state match (e.g., match 204 of FIG. 2) as depicted by the increase in power dissipated in the switches 624 in plot 610. The bottom plot 610 depicts the switch power (i.e., fraction of available generator power that is dissipated in the switches) against time. As seen, power that could be recovered by the system is instead lost as heat in the switches during the two illustrated switching events.

Figure 7:
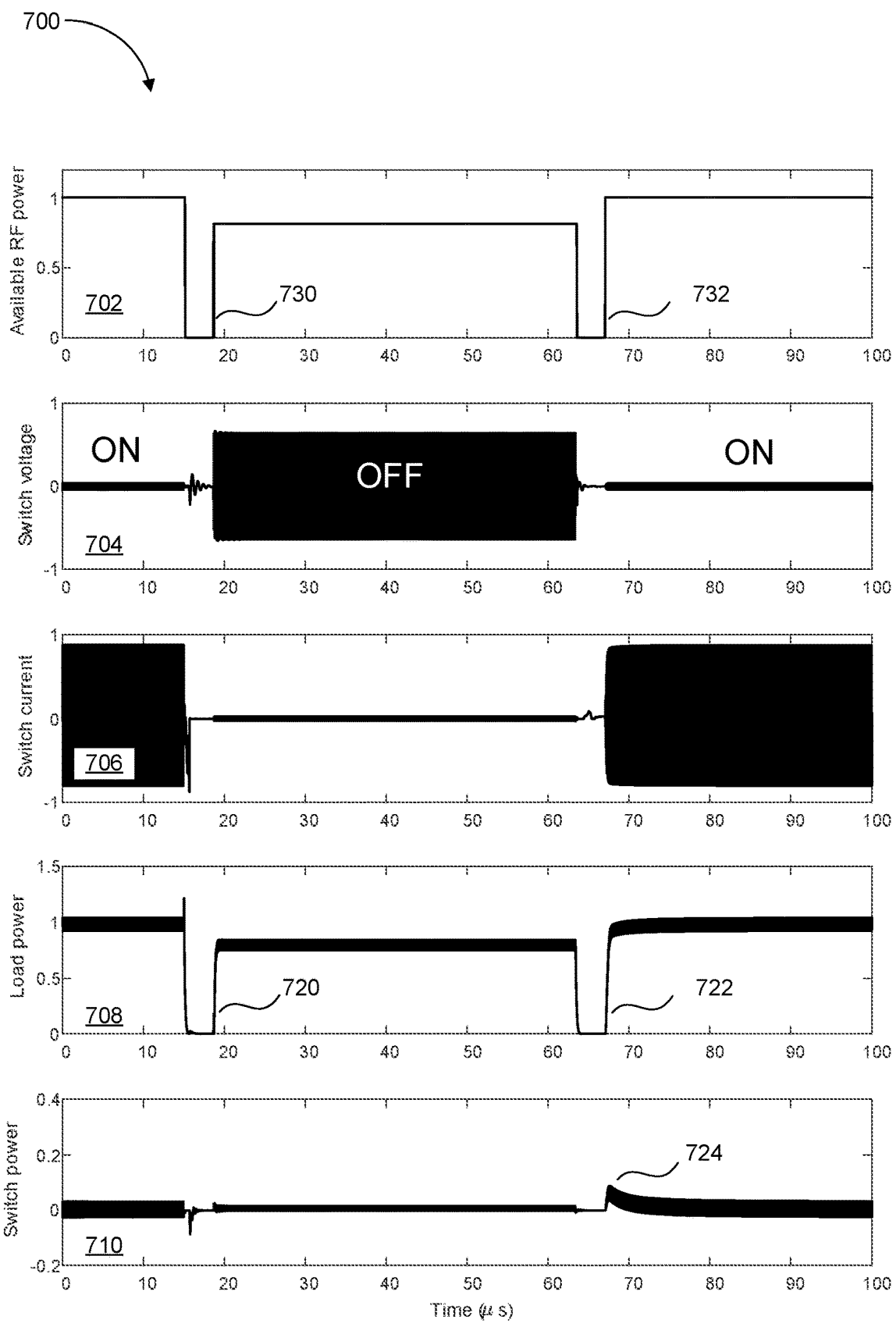
FIG. 7 illustrates waveforms in a power system, according to various aspects of the disclosure.

With implementation of the herein disclosed synchronization scheme, the plots in FIG. 7 can be achieved. FIG. 7 illustrates example waveforms 700 in a power delivery system, such as power delivery systems 100 and/or 200 in FIGS. 1 and/or 2, respectively. In some examples, the power delivery system comprises a generator, where the generator is turned off, or provides reduced power, in and around switching events. In other words, the example waveforms 700 correspond to a power delivery system in which power delivery is synchronized with switching, in accordance with aspects of the disclosure.

As shown in the top plot 702 of FIG. 7, rather than delivering power during the time that the switches in the solid-state match (e.g., match 204 of FIG. 2) change state (i.e., switch from ON to OFF or from OFF to ON), power is briefly interrupted for periods of time around the time that the switches in the SSM change state as depicted by 730 and 732 in plot 702. Furthermore, and as shown by 720 and 722 in plot 708, power delivery by the generator (e.g., generator 202 of FIG. 2) and thus power delivery to the load (e.g., load

206 of FIG. 2) are interrupted around the time that the switches change state. However, in terms of average and total power delivered, the decrease in power is relatively small. What is more, power delivery to the load is only slightly degraded, since there is already an interruption in power delivered to the load in traditional systems (compare 720 and 722 in plot 708 of FIG. 7 to the traditional interruption at 620 and 622 in plot 608 in FIG. 6), and on the upside, significantly less power is dissipated in the switches as indicated by 724 (compare to 624 in plot 610 in FIG. 6). In the case of the power delivery system associated with waveforms 700, power is interrupted for slightly longer times, but it is better controlled which may be an advantage in many applications. Specifically, the power is better controlled because the periods of uncertain power delivery 620 and 622 (e.g. uncertainty regarding how much of the available generator is delivered to the load and/or uncertainty regarding the duration of the low power periods) are replaced by periods of certain power delivery 720 and 722 (e.g., zero power is delivered to the load for periods of known duration) thereby enabling a more accurate determination of the energy delivered to the load (e.g., over the time period from 0 to 100 microseconds shown in FIG. 7).

In some embodiments, the synchronization scheme illustrated in FIG. 7 may be used for select periods of time and not during other times. For instance, where PIN diode temperature and/or power dissipation is being monitored and used in a feedback loop, the synchronization exemplified by FIG. 7 can be utilized when the temperature and/or power dissipation exceeds a threshold. Once temperatures and/or power dissipation return to acceptable levels, the synchronization can be turned off, for instance by returning to a scheme that results in power delivery as shown in FIG. 6. In other words, this disclosure can include switching between power delivery schemes as illustrated in FIGS. 6 and 7 depending on a feedback loop such as one based on PIN diode switch temperature and/or power dissipation. This alternation between full power (e.g., FIG. 6) and reduced power via synchronization (e.g., FIG. 7) can be based on feedback from junction temperature of a switch element, heatsink temperature, and/or ambient temperature, to name a few non-limiting examples.

Figure 8:
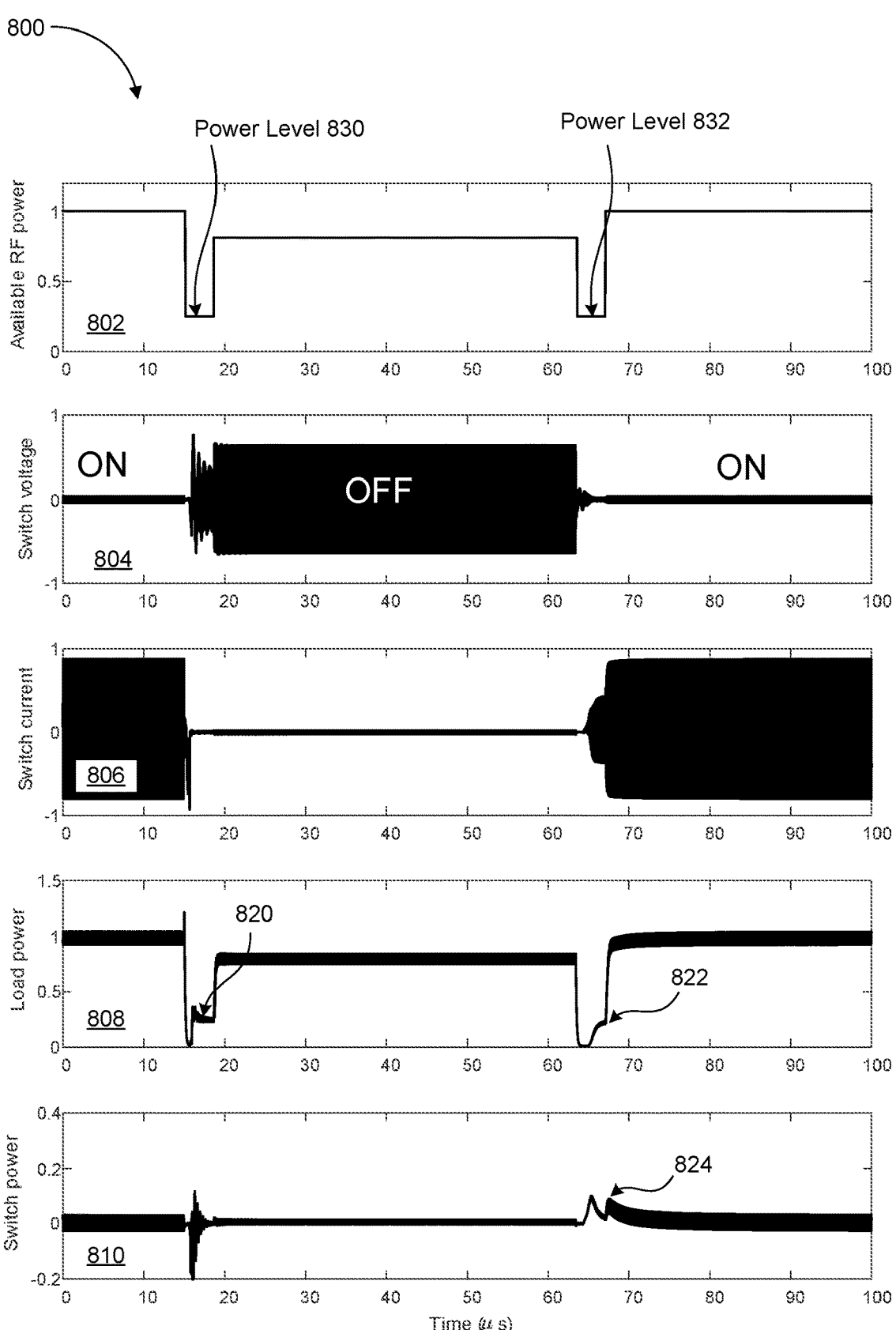
FIG. 8 illustrates waveforms in a power system, according to various aspects of the disclosure.

FIG. 8 illustrates example waveforms 800 in a power delivery system, such as power delivery system 100 of FIG. 1, operated in accordance with various aspects of the disclosure. As shown in the top plot 802 of FIG. 8, rather than delivering full power during the time that the switches in the solid-state match (e.g., match 204 of FIG. 2) change state (i.e., switch from ON to OFF or from OFF to ON), power is briefly reduced for periods of time around the time that the switches in the SSM change state as depicted by 830 and 832 in plot 802. Furthermore, and as shown by 820 and 822 in plot 808, by 820 and 822, power delivery by the generator (e.g., generator 202 of FIG. 2) and thus power delivery to the load (e.g., load 206 of FIG. 2) are reduced for periods of time around the time that the switches change state. However, in terms of average and total power delivered, the decrease in power is relatively small. What is more, power delivery to the load is only slightly degraded, since there is already an interruption in power delivered to the load in traditional systems (compare 820 and 822 in plot 808 of FIG. 8 to the traditional interruption at 620 and 622 in plot 608 in FIG. 6), and on the upside, significantly less power is dissipated in the switches as depicted by 824 (compare to 624 in plot 610 in FIG. 6). In the case of the power delivery system associated with waveforms 800, power is reduced for slightly longer times, but it is better controlled which may be an advantage in many applications. The power is better controlled because the periods of uncertain power delivery 620 and 622 (e.g. uncertainty about how much of the available generator is delivered to the load and uncertainty about the duration of the periods of low power) are replaced by periods where power delivery 820 and 822 is more certain (e.g., low power is delivered to the load for periods of known duration) thereby enabling a more accurate determination of the energy delivered to the load (e.g., over the time period from 0 to 100 microseconds shown in FIG. 8).

In some embodiments, the synchronization scheme illustrated in FIG. 8 may be used for select periods of time and not during other times. For instance, where PIN diode temperature and/or power dissipation is being monitored and used in a feedback loop, the synchronization exemplified by FIG. 8 can be utilized when the temperature and/or power dissipation exceeds a threshold. Once temperatures and/or power dissipation return to acceptable levels, the synchronization can be turned off, for instance by returning to a scheme that results in power delivery as shown in FIG. 6. Alternatively, the scheme represented by FIGS. 7 and 8 can be implemented in the same recipe as well as FIG. 6. For instance, where the reduced power of FIG. 7 is used at first when a temperature threshold is exceeded, power can be delivered according to FIG. 8 before returning to FIG. 6 (where FIG. 8 delivers more power than FIG. 7, but less power than FIG. 6). In other words, this disclosure can include switching between power delivery schemes as illustrated in FIGS. 6 and 8 (or 6, 7, and 8) depending on a feedback loop such as one based on PIN diode switch temperature and/or power dissipation. This alternation between full power (e.g., FIG. 6) and reduced power via synchronization (e.g., FIG. 7 or 8) can be based on feedback from junction temperature of a switch element, heatsink temperature, and/or ambient temperature, to name a few non-limiting examples.

Figure 9:
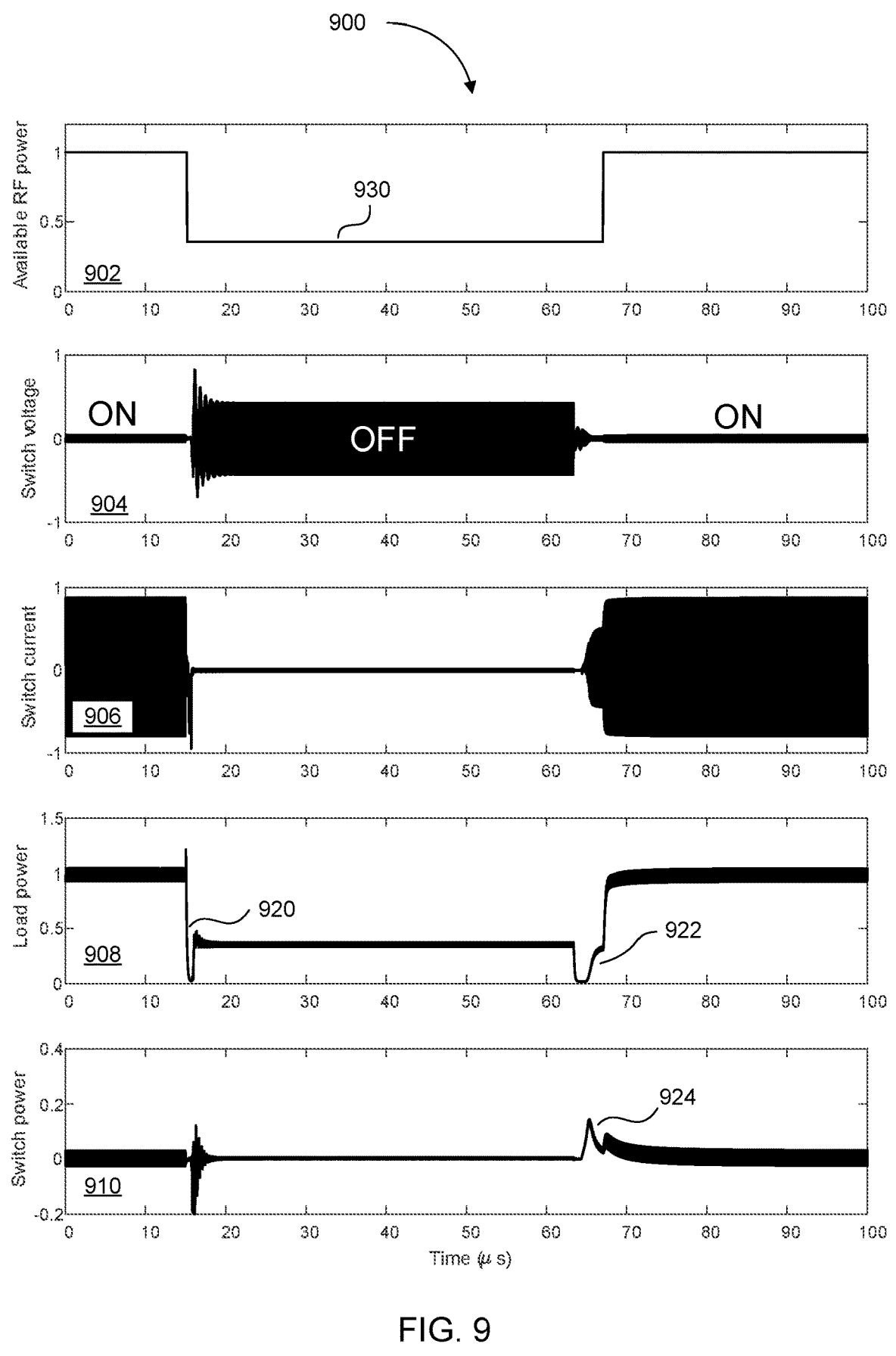

FIG. 9 illustrates example waveforms 900 in a power delivery system, such as power delivery system 100 of FIG. 1, operated in accordance with various aspects of the disclosure. As shown in the top plot 902 of FIG. 9, rather than delivering full power during the time that the switches in the solid-state match (e.g., match 204 of FIG. 2) change state (i.e., switch from ON to OFF or from OFF to ON), the timing of the generator is modified so that the switches change state during the time 930 when the generator delivers lower power. In some instances, the duration of the low power state (see 930) is extended as compared to the traditional power system. For example, a comparison of plot 602 of FIG. 6 and plot 902 of FIG. 9 shows that the duration of the low power state (930) is about 3 microseconds longer than in plot 602, which allows the switch state change to occur during the lower power state.

Furthermore, and as shown by 920 and 922 in plot 908, power delivery to the load (e.g., load 206 of FIG. 2) may be reduced for periods of time around the time that the switches change state. In some circumstances, the reduced power delivery may be due to an increase in reflected power since total power dissipation in the switches is not a significant fraction of the available power (as depicted by 924 in plot 910).

In some embodiments, the synchronization scheme illustrated in FIG. 9 may be used for select periods of time and not during other times. For instance, where PIN diode temperature and/or power dissipation is being monitored and used in a feedback loop, the synchronization exemplified by FIG. 9 can be utilized when the temperature and/or power dissipation exceeds a threshold. Once temperatures and/or power dissipation return to acceptable levels, the synchronization can be turned off, for instance by returning to a scheme that results in power delivery as shown in FIG. 6. Alternatively, the scheme represented by FIGS. 7, 8, and 9 can be implemented in the same recipe as well as FIG. 6. For instance, where the reduced power of FIG. 7 is used at first when a temperature threshold is exceeded, power can be delivered according to FIG. 8 and then FIG. 9 before returning to FIG. 6 (where FIG. 9 delivers more power than FIG. 7, but less power than FIG. 6). In other words, this disclosure can include switching between power delivery schemes as illustrated in FIGS. 6 and 9 (or 6, 7, 8, and 9) depending on a feedback loop such as one based on PIN diode switch temperature and/or power dissipation. This alternation between full power (e.g., FIG. 6) and reduced power via synchronization (e.g., FIG. 7, 8, or 9) can be based on feedback from junction temperature of a switch element, heatsink temperature, and/or ambient temperature, to name a few non-limiting examples.

Figure 10:
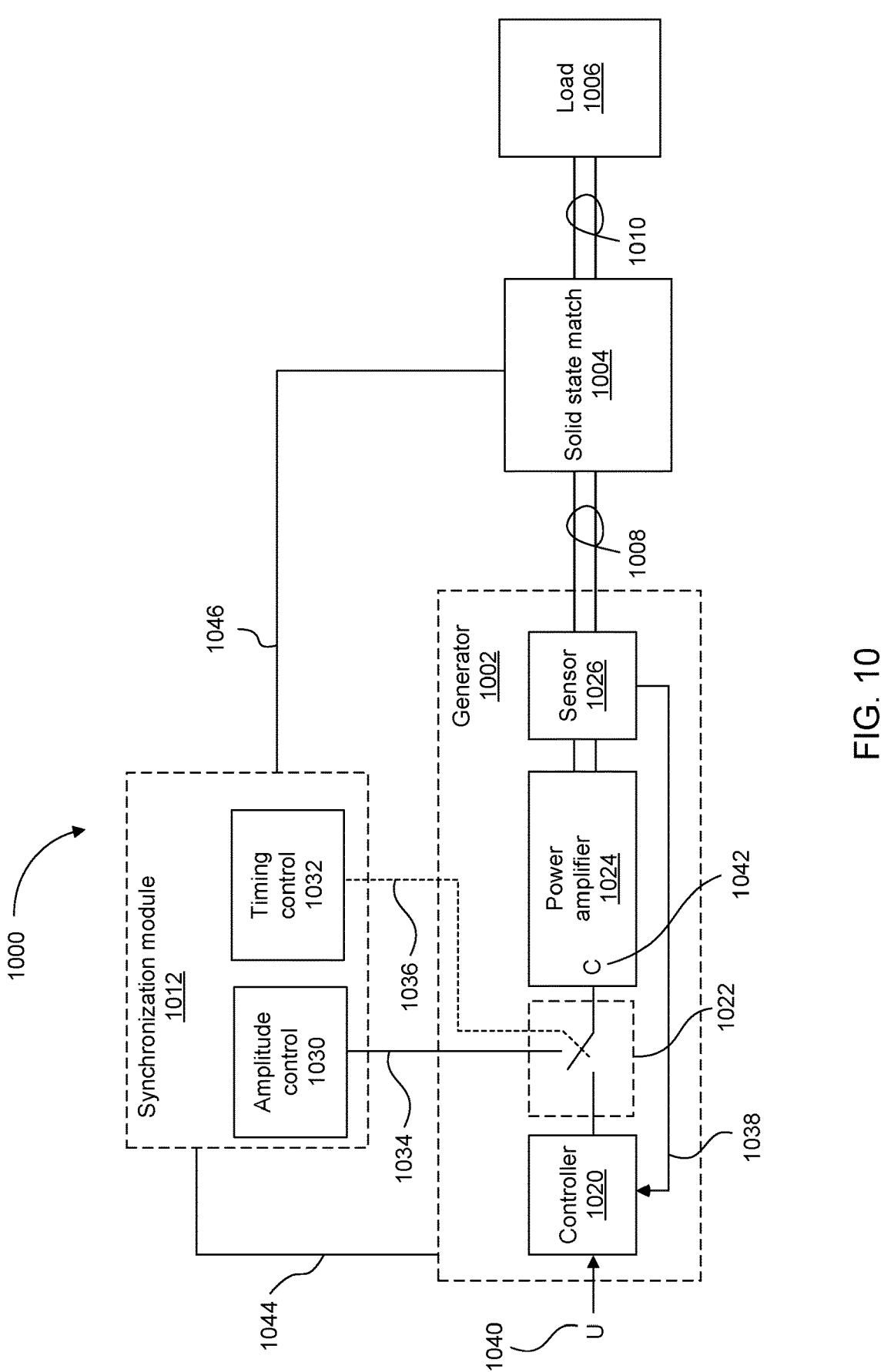
FIG. 10 is a block diagram illustrating a power system, according to various aspects of the disclosure.

FIG. 10 illustrates an example of a power system 1000 configured for synchronization control, in accordance with various aspects of the disclosure. The power system 1000 comprises a generator 1002, a SSM 1004, a load 1006, and a synchronization module 1012. The synchronization module 1012 may synchronize power delivery of the generator 1002 with the operation of the SSM 1004. The load 1006 may be nonlinear load, such as a plasma load. In some examples, the generator 1004 may be a RF generator. The synchronization module 1012 may be part of either the generator 1002 or match network 1004 or may be implemented as a separate unit. In some cases, the generator 1002 applies RF power to the match network 1004 via a transmission line 1008 (e.g., coaxial cable) and then onto the plasma load 1006 via an electrical connection 1010. One or more internal components (e.g., variable capacitors) of the SSM 1004 may be varied such that the input impedance of the match network 1004 matches (or is approximately equal to) a target input impedance (e.g., 50Ω). As previously noted, a match or "closeness" between two impedances may be quantitatively measured using a load reflection coefficient (F).

Most of the time, except when commanded otherwise by the synchronization module 1012, control of generator 1002 output power is performed via the first control source (e.g., controller 1020). In some cases, the controller 1020 receives a user input 1040 (e.g., user input commanding the generator to create the power waveform 902 of FIG. 9) and/or measured data 1038 obtained through sensor 1026 and adjusts a control signal 1042 provided to power amplifier 1024. When instructed by the synchronization module 1012, the control signal 1042 provided to the power amplifier 1024 is sent from another control source, such as amplitude control module 1030 in the synchronization module 1030. In some instances, a third control source (e.g., timing control module 1032) in the synchronization module 1012 helps adjust the timing of the change of the source of control signal 1042 via communication 1036. In some cases, the change in control signal 1042 source may be controlled using a switch 1022.

For example, the switch 1022 in the generator 1002 may be controlled using the timing control module 1032, where controlling the switch comprises coupling the power amplifier 1024 to the first control source (e.g., controller 1020) during a first time period, transitioning control of the power amplifier 1024 from the first control source to the second control source (e.g., amplitude control 1030), and coupling the power amplifier to the second control source during a second time period. In some cases, the first control source, such as controller 1020, outputs at least one first control signal (e.g., control signal 1042). Additionally, the second control source outputs at least one second control signal. As further described below, the synchronization module 1012 may obtain timing information 1046 from the SSM 1004. The SSM 1004 may comprise one or more switches.

Furthermore, the timing information may comprise information pertaining to time periods when the one or more switches change state, e.g., from an open state to a close state, or vice-versa. The timing control module 1032 (or alternatively, the synchronization module 1012) may determine a first time period where the first control source is active, a second time period where the second control source is active, and/or a time for switching from the first to the second control source or vice versa. In some cases, the synchronization module 1012 receives feedback information related to data measured during one or more of the first time period and the second time period. Additionally, the synchronization module 1012 and/or the controller 1020 may adjust one or more of the at least one first control signal and the at least one second control signal, based at least in part on the feedback information. In some embodiments, the synchronization module 1012 and/or the controller 1020 is configured to one of pause, reduce, resume, or increase the power delivered by the generator 1002 to the SSM 1004 at or around the time periods when one or more switches of the SSM change state, described in further detail below. For example, the power amplifier 1024 may receive an indication to one of pause, reduce, or increase power output for each of the one or more time periods when the one or more switches of the SSM change state, where the indication is received via one of the first control signal (e.g., control signal received from the first control source, such as controller 1020) and the second control signal (e.g., control signal received from the second control source, such as amplitude control module 1030).

In some examples, the amplitude control module 1030 may instruct the power amplifier 1024 to pause power output for time periods around the time that the switches of SSM 1004 change state (depicted by the periods 730 and 732 in plot 702 of FIG. 7). The "time periods around the time that the switches of SSM 1004 change state" (depicted by the periods 730 and 732 in plot 702 of FIG. 7) may be determined by a number of factors, including, but not limited to, how fast the power in the generator can be altered (i.e., how fast the power amplifier 1024 responds to a change in the control input 1042) and for how long the switch or switches of SSM 1004 remains in a high loss state after a state change is initiated. For example, if the generator takes 1 microsecond to cease or reduce power delivery and the switch or switches remain in a high loss state for 3 microseconds, the time periods around the time that the switches of SSM 1004 change state may start 1 microsecond before the initiation of the state change of the switches in SSM 1004 and last for 4 microseconds. Although power amplifier 1024 is shown with only a control input, power amplifier 1024 may typically also receive a RF drive signal (e.g. a 13.56 MHz RF signal, not shown) and the output of the power amplifier 1024 may also be interrupted by interrupting the RF drive signal rather than through the control input 1042. In some cases, interrupting a RF drive signal may be a faster way of interrupting power from the power amplifier 1024 and may allow for a shorter interruption of power. Alternatively, the amplitude control module 1030 may instruct the power amplifier 1024 to reduce power for time periods around the time that the switches of SSM 1004 change state (depicted by the periods 830 and 832 in plot 802 of FIG. 8). In some cases, the synchronization module 1012 receives feedback on the power level during a reduced power period, where the feedback information is received via communication 1044 with the generator 1002. In some examples, the amplitude control module 1030 utilizes the feedback information to optimize control signal(s) sent to the power amplifier 1024.

Additionally, or alternatively, the synchronization module 1012 obtains timing information via communications 1044, 1046 with the generator 1002 and SSM 1004, respectively. In some embodiments, communication 1044 between the synchronization module 1012 and the generator 1002 and/or communication 1046 between the synchronization module 1012 and the SSM 1004 may be performed via dedicated signals (e.g., a signal changing logic state when switches in the SSM 1004 change state; a signal changing logic state when the generator 1002 changes its power output level), serial communication means (e.g., an ethernet link), or a combination thereof. In some aspects, the direct interface between the synchronization module 1012 and the control input 1042 of the power amplifier enables high speed synchronization.

In accordance with aspects of the present disclosure, power delivery by the generator (e.g., generator 1002) to the match network (e.g., SSM 1004) may be synchronized with the opening and closing of switches in the SSM based at least in part on estimating a temperature of a device, a switch, etc., in the match network, further described below in relation to FIGS. 11-13. In some embodiments, one or more thermal models are utilized to model or estimate one or more of: (1) voltages and/or currents that a switch is subject to, (2) power dissipation in a switch, (3) junction temperature of a switch element, (4) rise in junction temperature above ambient temperature for one or more switches of the SSM, to name a few non-limiting examples. Furthermore, power delivery by the generator may be adjusted based on the estimated/modeled temperature of the device (e.g., switch) in the SSM. In some examples, power delivery may be paused or reduced at or around the time periods when one or more switches of the SSM network change state, for instance, when the estimated temperature is above a safety threshold. In some examples, the synchronization module can cause the generator to resume power delivery at or around the time periods when one or more switches of the SSM network change state, for instance, when the estimated temperature is below the safety threshold. In some examples, the synchronization module can cause the generator to increase power delivery at or around the time periods when one or more switches of the SSM network change state, for instance, when the estimated temperature is below the safety threshold and when the generator is in a reduced power state (i.e., outputting lower power).

Figure 11:
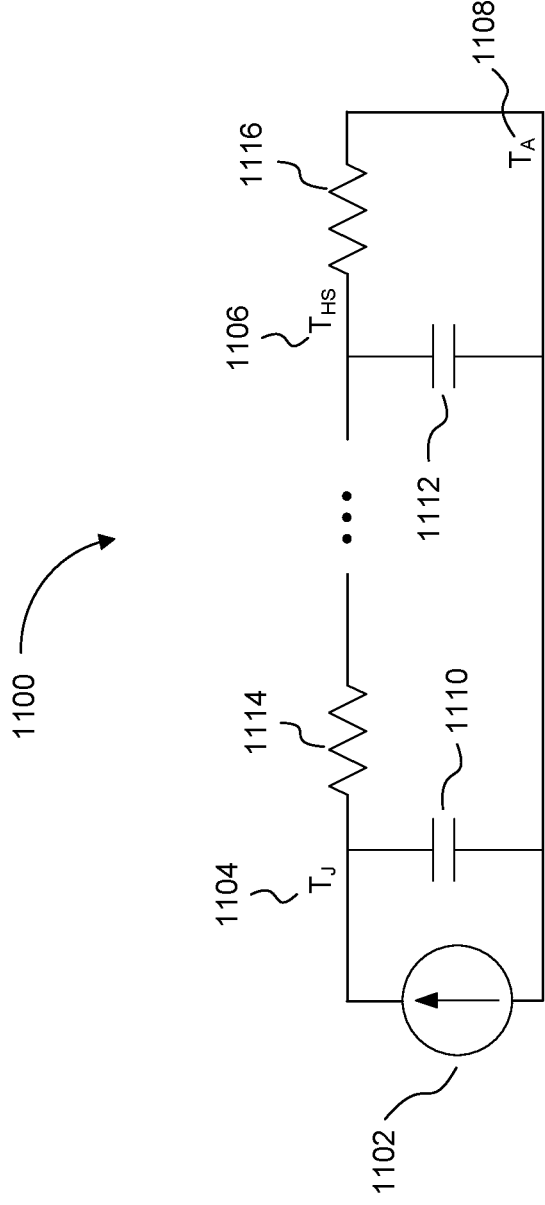
FIG. 11 illustrates a thermal model, according to various aspects of the disclosure.

Turning now to FIG. 11 which illustrates an example of a thermal model 1100 for a switch (e.g., switch $S_1$, $S_2$, . . . , $S_N$ of FIG. 3A), according to various aspects of the disclosure. Thermal model 1100 comprises source 1102 for estimating power dissipated in the switch. In some examples, power dissipation may be estimated from measuring or estimating the voltages and currents that a switch is subjected to. The thermal model 1100 further includes various thermal resistances e.g., thermal resistances 1114 and 1116. Resistance 1114 may be used to model the thermal resistance from the junction to the case of a switch element, e.g., a PIN diode. Resistance 1116 may be used to model the resistance from a heatsink to the ambient air. Various temperatures may be modeled including, but not limited to, the junction temperature 1104, heatsink temperature 1106, and ambient temperature 1108. Furthermore, thermal capacity may be modeled by capacitors 1110, 1112. Capacitor 1110 may be used to model the thermal capacity of the die of a semiconductor, e.g., a PIN diode, used in a switch. Additionally, capacitor 1112 may be used to model the thermal capacity of a heatsink. In some instances, the thermal model 1100 together with estimates of the power dissipation 1102 may be used to calculate (or estimate) the junction temperature of a switch element.

Figure 12A:
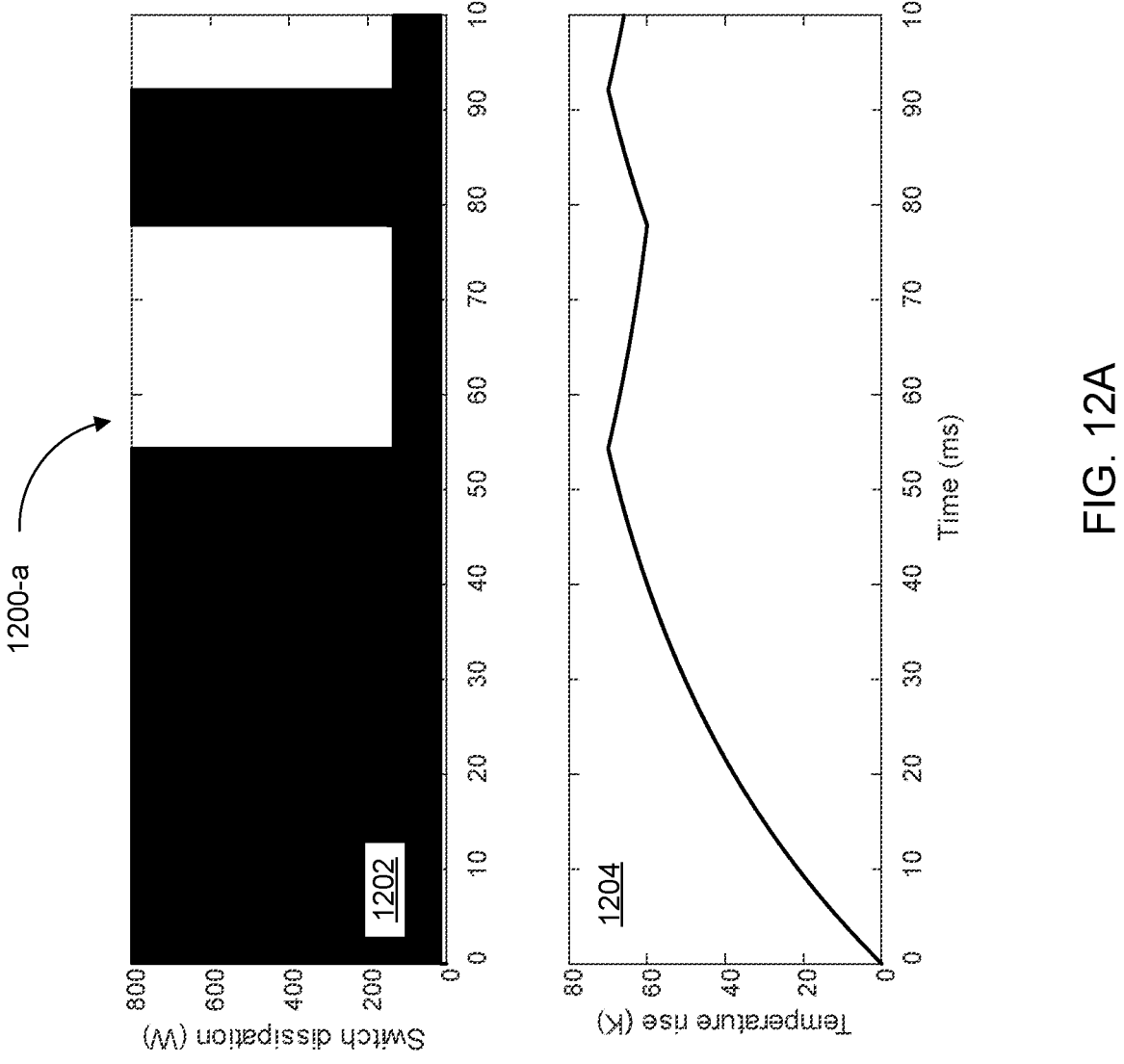
FIG. 12A illustrates dissipation and temperature waveforms for a solid-state match, according to various aspects of the disclosure.

FIG. 12A illustrates example dissipation and temperature waveforms 1200-*a* in a SSM of a power delivery system, according to various aspects of the disclosure. The top plot 1202 in FIG. 12A shows switch dissipation (i.e., power dissipated in one or more switches of the SSM), while plot 1204 depicts the estimated rise in junction temperature above ambient temperature for one or more switches of the SSM.

Figure 12B:
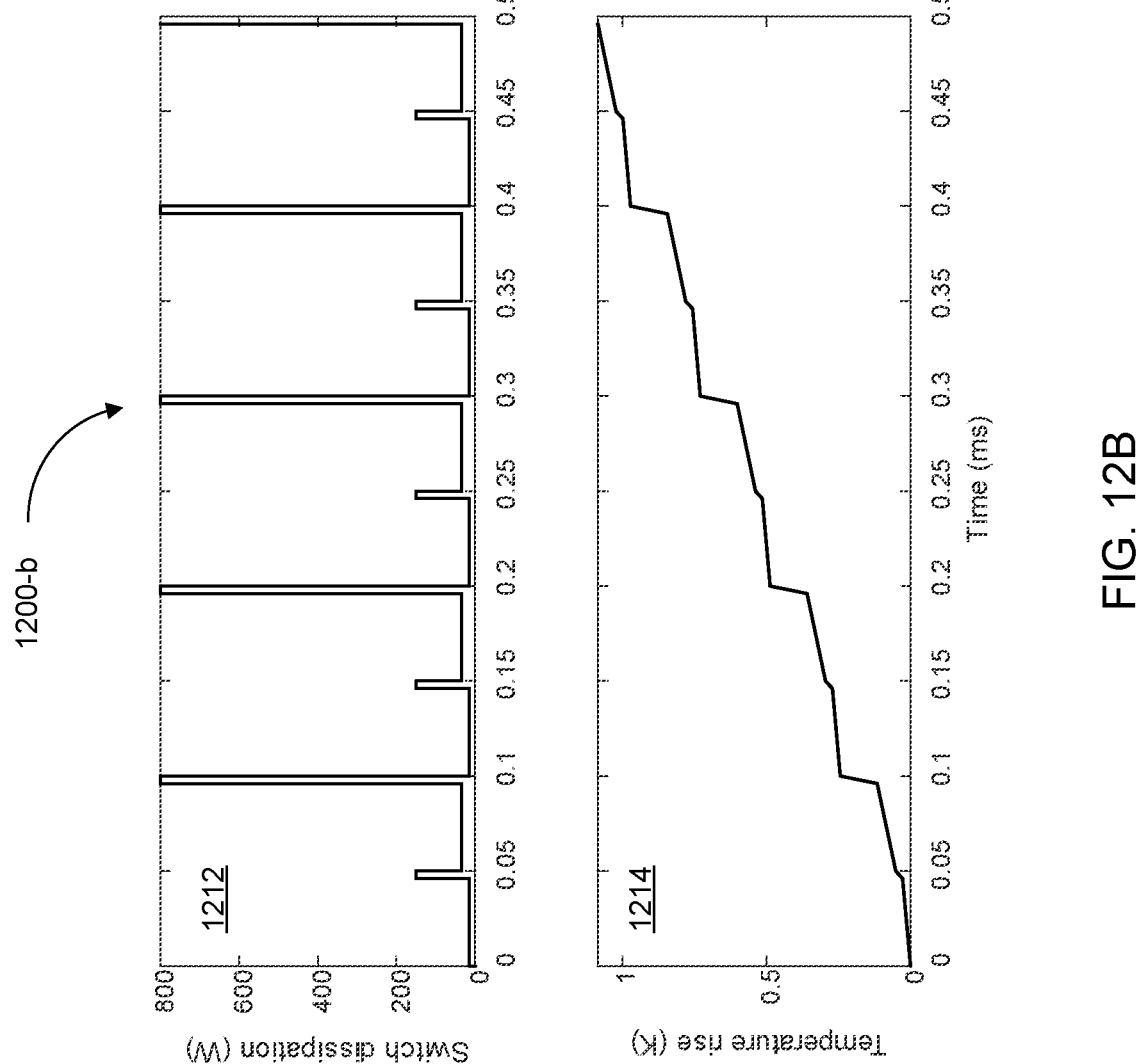
FIG. 12B illustrates dissipation and temperature waveforms for a solid-state match, according to various aspects of the disclosure.

In some examples, the rise in junction temperature may be calculated or estimated using a thermal model of the device, where the thermal model may be similar or substantially similar to the thermal model 1100 described in relation to FIG. 11. With an ambient temperature of 55° C. and maximum safe junction temperature of 125° C. a maximum rise of 70 K may be allowed before action needs to be taken to keep the junction temperature below the safe level of 125° C. Before the junction temperature rise reaches 70 K, the power delivery system may be operated in accordance with the waveforms 600 of FIG. 6. It should be noted that the switch power waveform 610 in FIG. 6 may not capture all sources of dissipation in the switches in SSM. For instance, the switch power waveform 610 may only capture the fraction of RF power that is dissipated in the switches. In addition to RF power, DC power from the driver (e.g., the circuit driving the PIN diode in switch 400 of FIG. 4) may also be dissipated in the switches. Plot 1212 in FIG. 12B depicts both RF and DC power dissipation in a PIN diode of a switch in a PIN diode match. Additionally, plot 1214 in FIG. 12B depicts the corresponding rise in junction temperature.

Figure 12C:
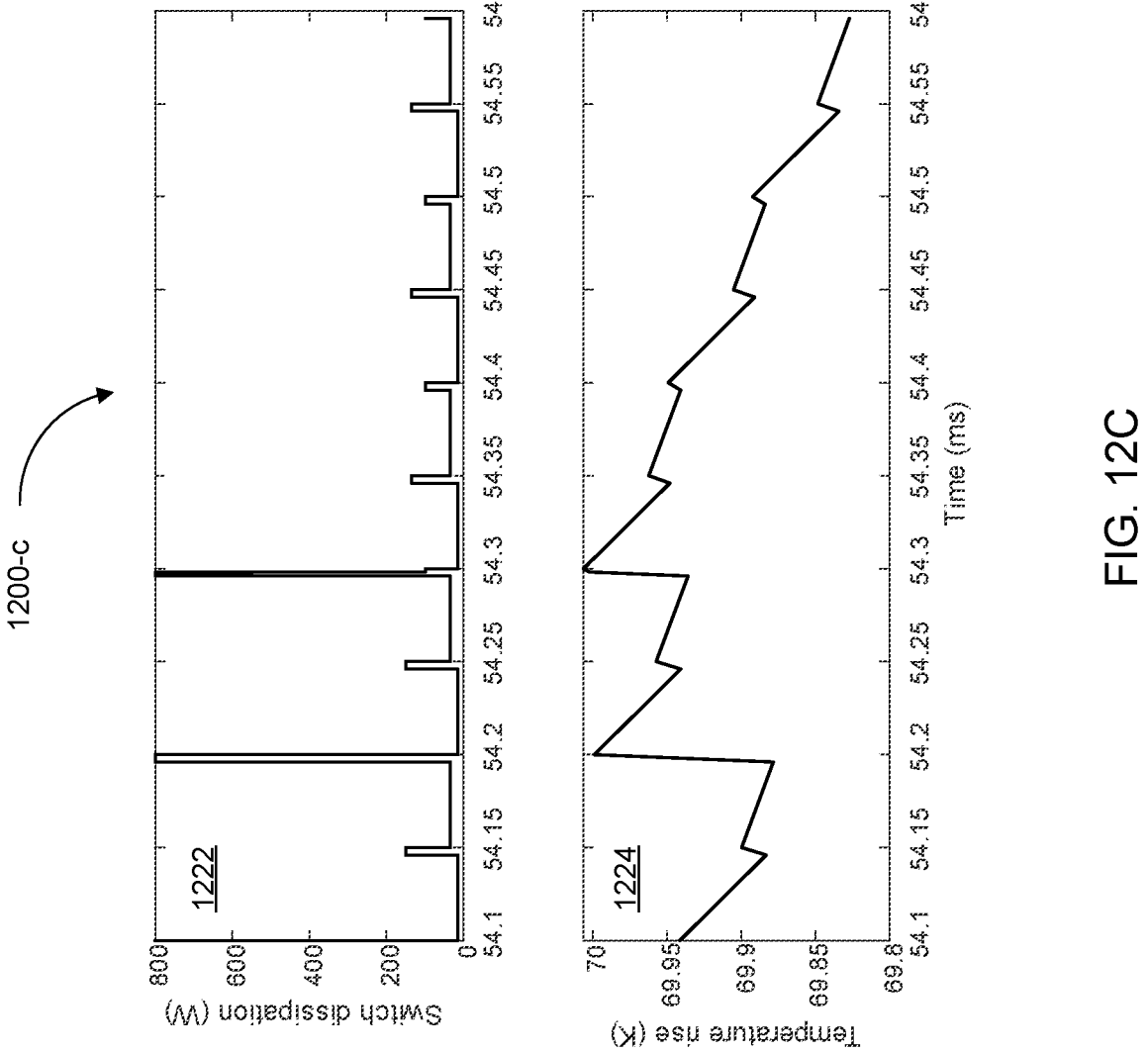
FIG. 12C illustrates dissipation and temperature waveforms for a solid-state match, according to various aspects of the disclosure.

As shown in plot 1224 of FIG. 12C, the junction temperature rise of the PIN diode may exceed the safe limit of 70 K after approximately 54.3 ms. In such cases, the power delivered by the generator may be adjusted such that the generator power delivery waveform is similar or substantially similar to plot 702 in FIG. 7. This adjustment of generator power helps reduce the dissipation in the PIN diode. Specifically, changing to the power delivery waveform 702 of FIG. 7 reduces the dissipation in the PIN diode, thus allowing the temperature rise of the PIN diode junction to decrease as shown in FIG. 12C.

Some hysteresis may be employed to switch between the waveforms 602 of FIG. 6 and 702 of FIG. 7. In some aspects, this may help reduce the junction temperature rise of the PIN diode to a lower limit, for instance, ~60K-70K as shown in plot 1204 of FIG. 12A. In some circumstances, however, switching between waveforms may not be preferred, for instance, when precision in power delivery is of higher importance. In such cases, the generator power delivery waveform in plot 702 may be utilized instead.

Figure 13A:
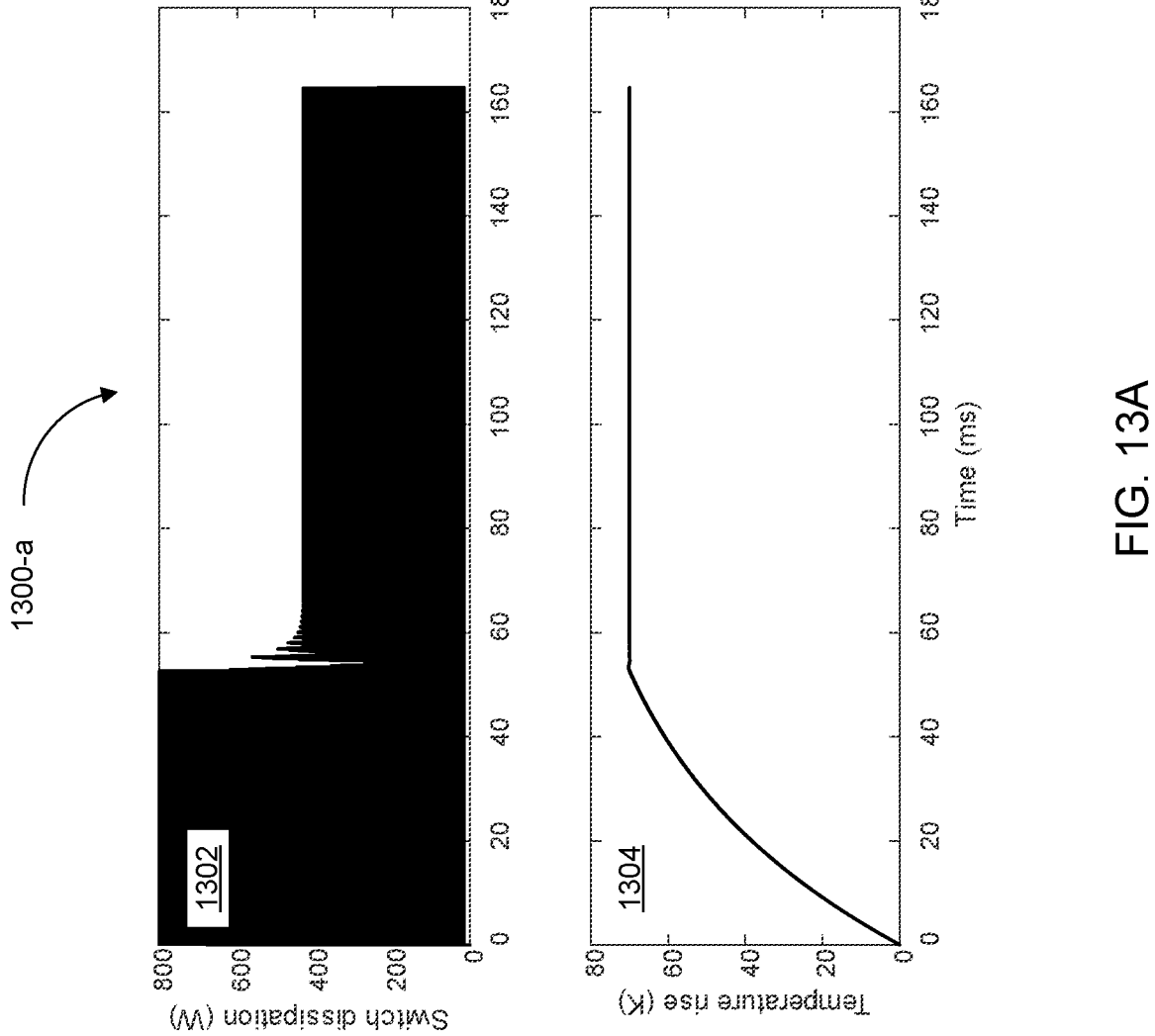
FIG. 13A illustrates dissipation and temperature waveforms for a solid-state match, according to various aspects of the disclosure.

FIG. 13A illustrates example dissipation and temperature waveforms 1300-*a* in a SSM of a power delivery system, according to various aspects of the disclosure. Plot 1302 shows switch dissipation (or power dissipated in a switch of the SSM) against time. Additionally, plot 1304 illustrates temperature rise (e.g., estimated rise in junction temperature above ambient temperature) against time. As previously noted, the rise in junction temperature may be calculated using a thermal model of the device, where the thermal model may be similar or substantially similar to the thermal model 1100 of FIG. 11. With an ambient temperature of 55° C. and maximum safe junction temperature of 125° C., a maximum rise of 70 K may be allowed before the junction temperature needs to be reduced (e.g., by varying the power delivery waveform for the generator).

Figure 13B:
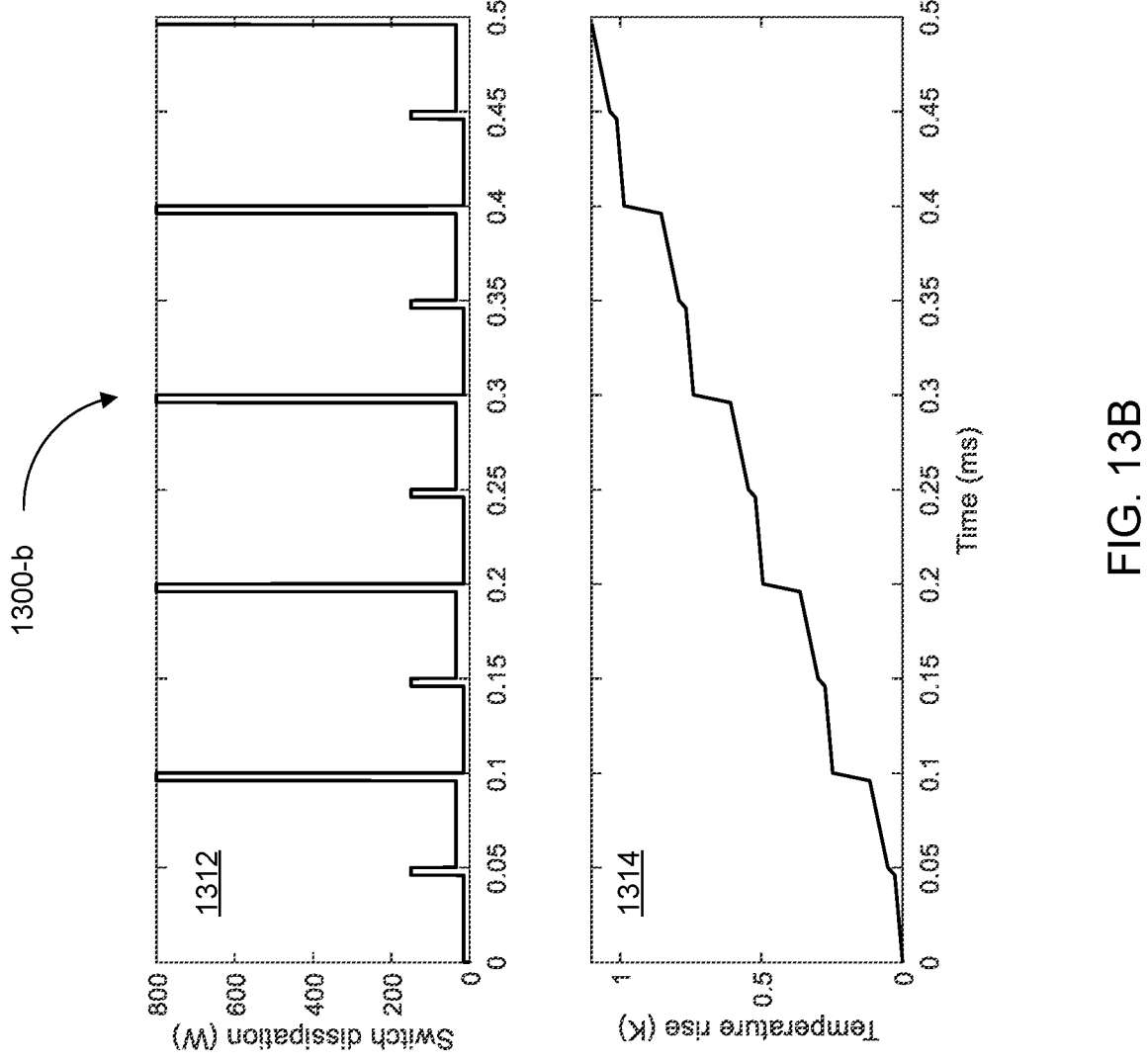
FIG. 13B illustrates dissipation and temperature waveforms for a solid-state match, according to various aspects of the disclosure.

In some embodiments, the power delivery system may initially be operated with the waveforms 600 of FIG. 6 (i.e., before the junction temperature rise reaches 70 K). It should be noted that switch power waveform 610 of FIG. 6 may not capture all sources of dissipation in the switches in a PIN diode match. For instance, waveform 610 may only capture the fraction of RF power that is dissipated in the switches. In addition to RF power, DC power from the driver (e.g., the circuit driving the PIN diode in switch 400 of FIG. 4) may also be dissipated in the switches. Plot 1312 in FIG. 13B depicts both RF and DC power dissipation in a PIN diode of a switch in a PIN diode match. Additionally, plot 1314 in FIG. 13B depicts the corresponding rise in junction temperature.

Figure 13C:
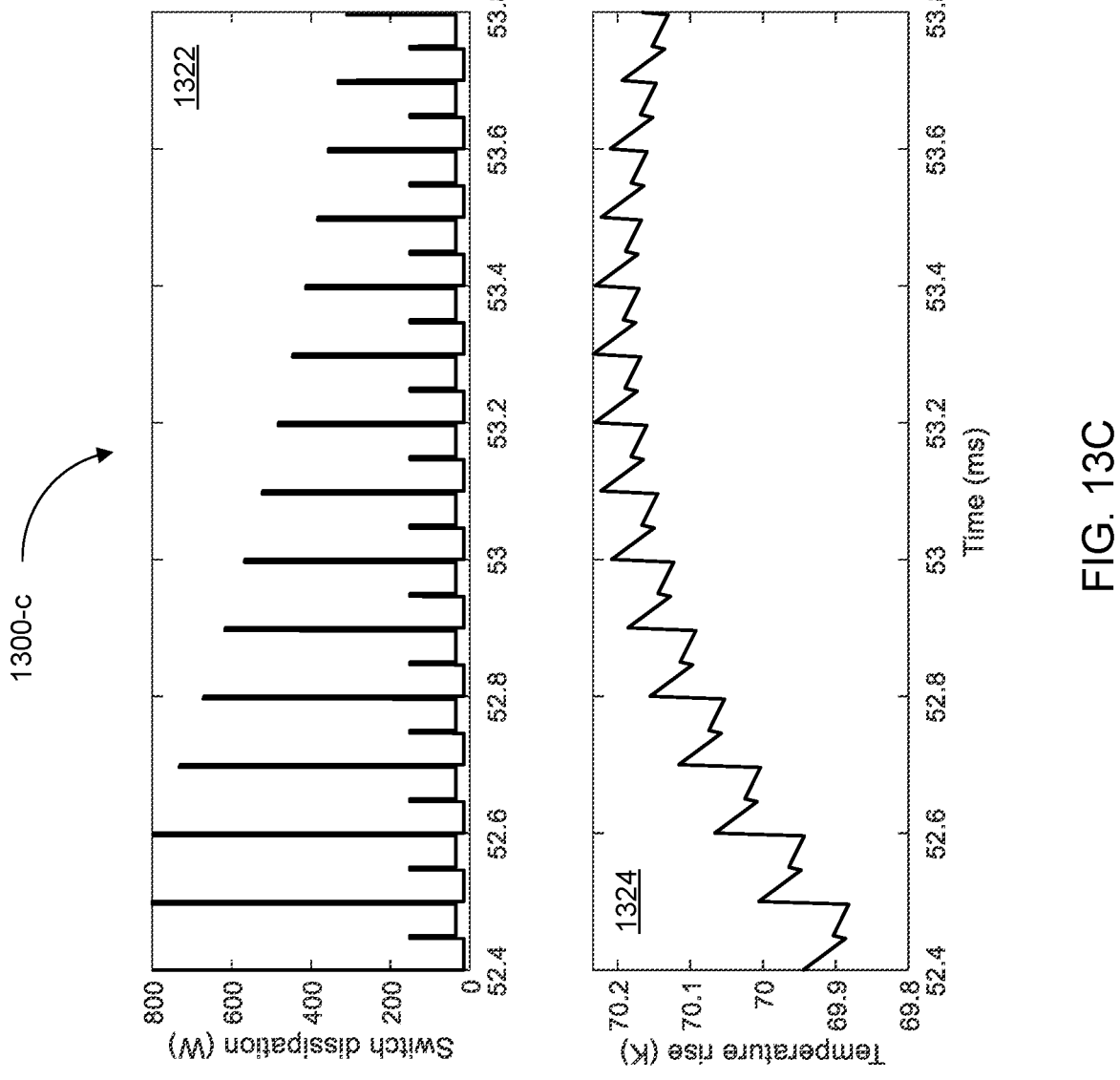
FIG. 13C illustrates dissipation and temperature waveforms for a solid-state match, according to various aspects of the disclosure.

As shown in plot 1324 of FIG. 13C, the junction temperature rise of the PIN diode exceeds the safe limit of 70 K after approximately 52.5 ms. In some examples, the power delivered by the generator may be adjusted to decrease said junction temperature rise such that it is below the threshold/safety limit. In one non-limiting example, the power delivered by the generator may be adjusted such that the generator power delivery waveform is similar or substantially similar to plot 802 in FIG. 7. Changing to the power delivery waveform 802 helps reduce the power dissipation in the PIN diode, which in turn helps decrease the temperature rise of the PIN diode junction. In this case (compared to waveforms 1200-*c* in FIG. 12C), the reduction in power (e.g., the power levels depicted by 830 and 832 in plot 802) may be controlled to limit the junction temperature rise <70 K. In some circumstances, however, continuously changing the power delivery waveform may not be an option. In such cases, the power delivery system may use fixed power levels, such as the power levels 830 and 832 in FIG. 8.

FIG. 14 shows an example of a method 1400 for operating a power delivery system, according to various aspects of the present disclosure. In some embodiments, the operations of method 1400 may be implemented in the power delivery system 1000 in FIG. 10. In some cases, one or more of the operations described below may be implemented using one or more modules/elements described in relation to FIG. 10, including at least the synchronization module 1012 and generator 1002.

The method 1400 starts with delivering power from a generator to a load through a solid-state impedance matching network (operation 1402). The solid-state impedance matching network may be similar or substantially similar to any of the SSMs described herein, including at least SSM 204 in FIG. 2.

Next, operation 1404 comprises synchronizing the power delivered from the generator with the opening and closing of switches in the solid-state impedance matching network. In some cases, the power delivery system may comprise a synchronization module (e.g., synchronization module 1012 in FIG. 10), where the synchronization module may include one or more of an amplitude control module (e.g., amplitude control module 1030 in FIG. 10) and a timing control module (e.g., timing control module 1032). In some examples, the amplitude control module and timing control module may be implemented as a single control module.

Additionally, the synchronization module, including its submodules, may be embodied in hardware, software, or a combination thereof.

In some cases, at operation 1406, the method 1400 comprises stopping power delivery from the generator for at least one time period around the opening and closing of switches in the solid-state impedance matching network. As described in relation to FIG. 10, the amplitude control module 1030 in the synchronization module 1012 may instruct (e.g., via communication 1034) the power amplifier 1024 to pause/stop power output for time period(s) around the time(s) that the switches of the solid-state impedance matching network change state. In this way, power delivery from the generator to the load (e.g., plasma load) can be stopped around the times when the switches of the SSM are opened or closed. In some aspects, such a design helps (1) minimize or reduce power dissipation in switches, and (2) control junction temperature rise in the switches (or PIN diodes used to implement the switches) such that it is below a threshold/safety limit. Additionally, pausing or stopping power delivery around the times when the switches are being opened and closed has minimal to no effect on the average and total power delivered by the generator to the load. However, the reduction in power dissipation in switches facilitates in enhancing efficiency of the power delivery system, as compared to the prior art. Stopping power delivery is exemplified, though not limited by, the example shown in FIG. 7, where normal power delivery is exemplified, though not limited by, the example shown in FIG. 6.

FIG. 15 shows an example of a method 1500 for operating a power delivery system, according to various aspects of the disclosure. In some embodiments, the operations of method 1500 may be implemented in the power delivery system 1000 in FIG. 10. In some cases, one or more of the operations described below may be implemented using one or more modules/elements described in relation to FIG. 10, including at least the synchronization module 1012 and generator 1002.

At operation 1502, the method 1500 comprises delivering power from a generator (e.g., generator 1002) to a load (e.g., load 1006, maybe a plasma load) through a solid-state impedance matching network (e.g., SSM 1004)).

Next, operation 1504 comprises synchronizing the power delivered from the generator with the opening and closing of switches in the solid-state impedance matching network.

Lastly, operation 1506 comprises reducing power delivery from the generator for at least one time period around the opening and closing of switches in the solid-state impedance matching network.

Reducing power delivery is exemplified, though not limited by, the examples shown in FIGS. 8 and 9, where normal power delivery is exemplified, though not limited by, the example shown in FIG. 6.

Figure 16:
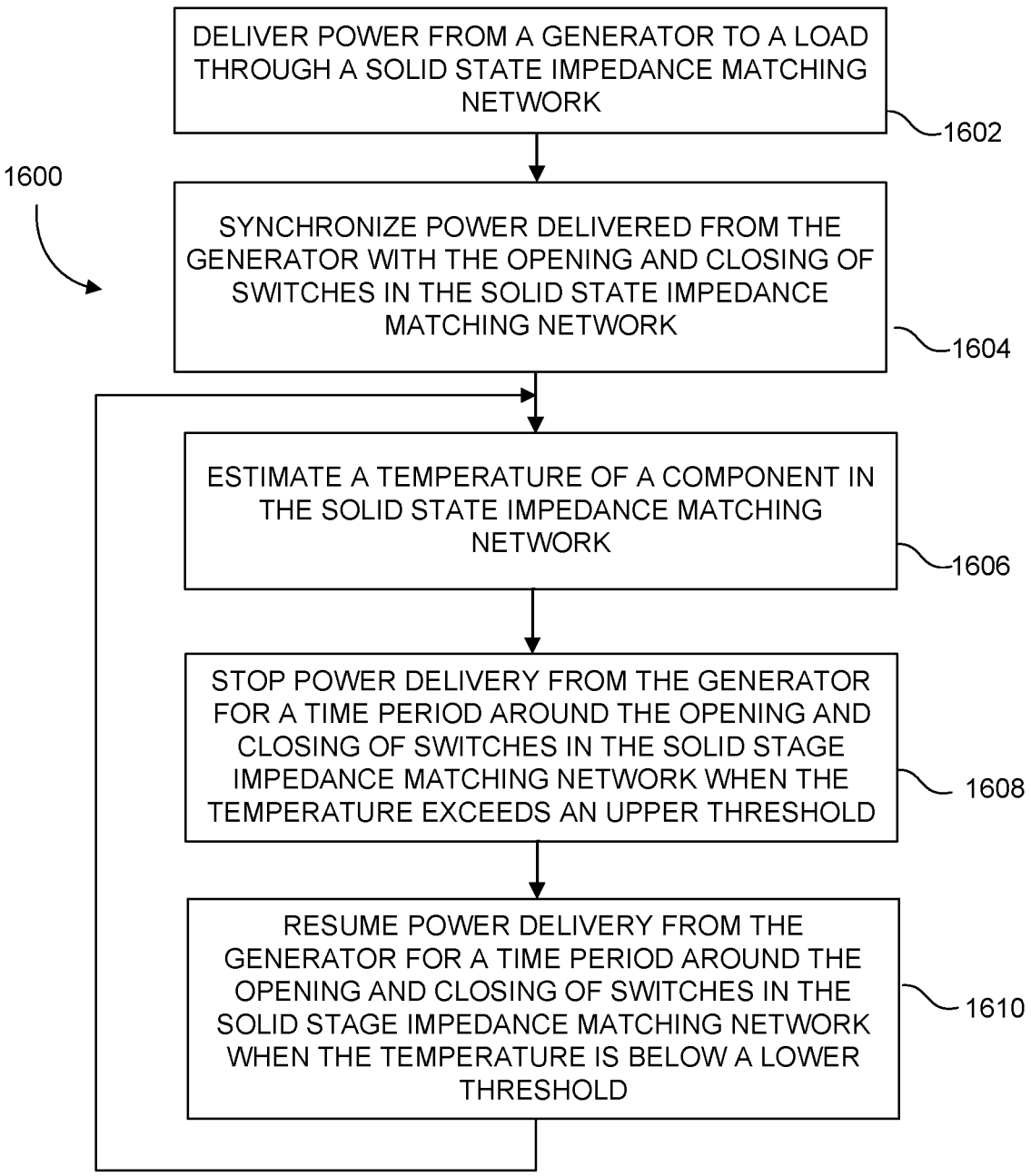
FIG. 16 illustrates an example of a method for operating a power system, according to various aspects of the disclosure.

FIG. 16 shows an example of a method 1600 for operating a power delivery system, according to various aspects of the disclosure. In some embodiments, the operations of method 1600 may be implemented in the power delivery system 1000 in FIG. 10. In some cases, one or more of the operations described below may be implemented using one or more modules/elements described in relation to FIG. 10, including at least the synchronization module 1012 and generator 1002.

The method 1600 starts with delivering power from a generator to a load through a solid-state impedance matching network (operation 1602). Next, power delivered from the generator is synchronized with the opening and closing of switches in the solid-state impedance matching network (operation 1604). Next, a temperature of a component (e.g., PIN diode switch) in the solid-state impedance matching network is estimated (operation 1606). In some embodiments, the temperature of the component may be estimated using the thermal model 1100 previously described in relation to FIG. 11. In some examples, if the temperature of the component exceeds an upper threshold (e.g., >125 degrees C., >70 degrees above ambient temperature, where the ambient temperature may be 55 degrees C., to name two non-limiting examples), power delivery from the generator is stopped for one or more time periods around times when switches in the solid-state impedance matching network are opened or closed.

In some circumstances, pausing (or at least, reducing) power delivery from the generator can help decrease the temperature of the component (e.g., PIN diode) such that it drops below the safety threshold. In some cases, for instance, when the temperature is below the upper threshold, operation 1610 comprises resuming power delivery from the generator for at least one time period around when the switches in the solid-state impedance matching network are opened or closed.

As seen in FIG. 16, one or more of operations 1606, 1608, and 1610 may be repeated for as long as the generator (e.g., RF generator) delivers power to the load.

Stopping power delivery is exemplified, though not limited by, the example shown in FIG. 7, where normal power delivery is exemplified, though not limited by, the example shown in FIG. 6.

Figure 17:
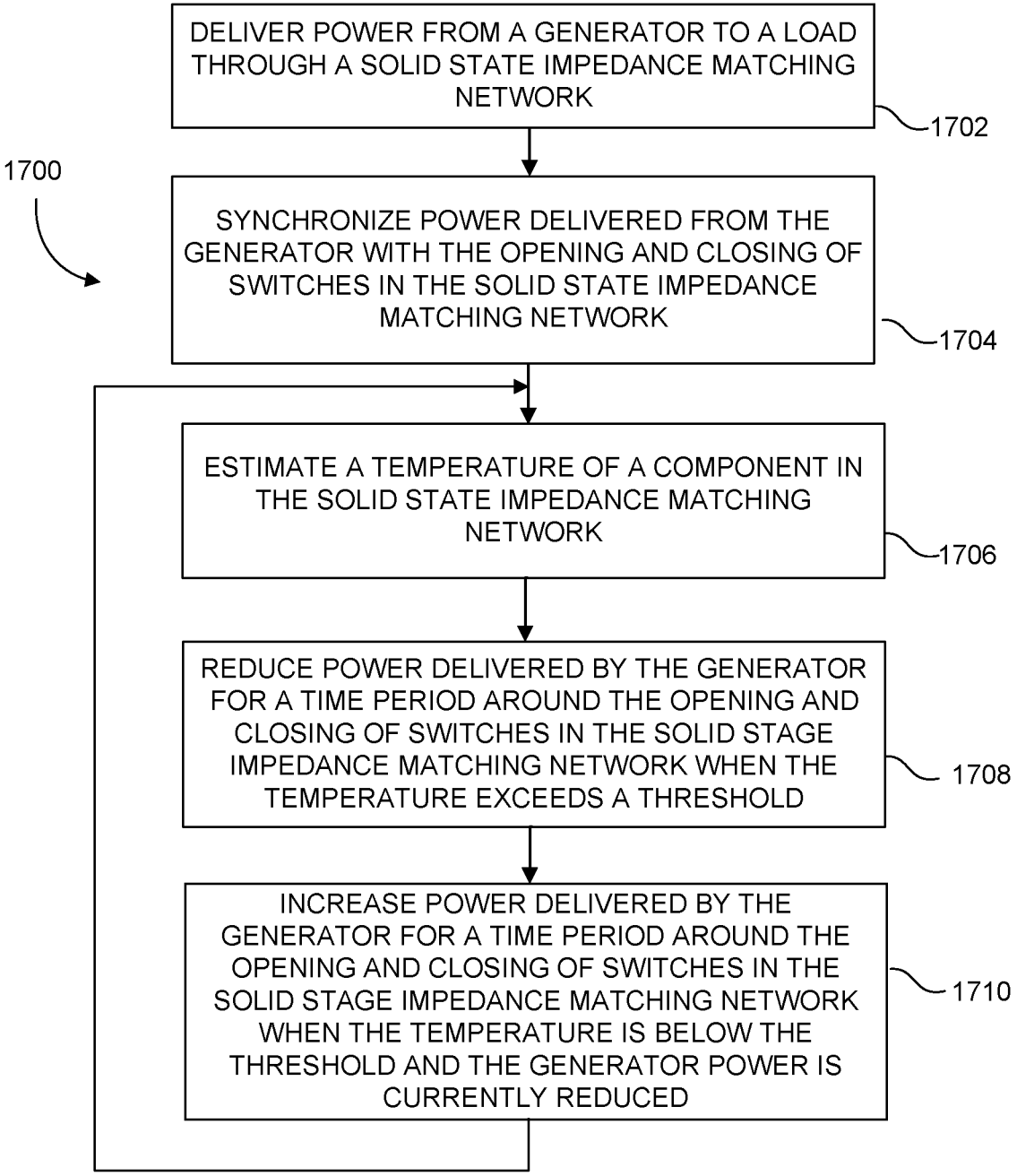
FIG. 17 illustrates an example of a method for operating a power system, according to various aspects of the disclosure.

FIG. 17 shows an example of a method 1700 for operating a power delivery system, according to various aspects of the present disclosure. In some embodiments, the operations of method 1700 may be implemented in the power delivery system 1000 in FIG. 10. In some cases, one or more of the operations described below may be implemented using one or more modules/elements described in relation to FIG. 10, including at least the synchronization module 1012 and generator 1002.

At operation 1702, the method 1700 comprises delivering power from a generator (e.g., generator 1002) to a load (e.g., load 1006) through a solid-state impedance matching network (e.g., SSM 1004).

Operation 1704 comprises synchronizing the power delivered from the generator with the opening and closing of switches in the solid-state impedance matching network.

Operation 1706 comprises estimating (e.g., using a thermal model, such as thermal model 1100 of a PIN diode) a temperature of a component in the solid-state impedance matching network. Some non-limiting examples of the component may include a switch, a PIN diode, a switch comprising at least one PIN diode, PIN diode junction, and a heatsink. It should be noted that, in some embodiments, various temperatures may be modeled/estimated using one or more thermal models. In some embodiments, one or more of a junction temperature of a switch element, heatsink temperature, and/or ambient temperature may be modeled or estimated in operation 1706.

Next, at operation 1708, the method 1700 comprises reducing the power delivery from the generator for at least one time period around when the switches in the solid-state impedance matching network are opened/closed, where the power reduction is based at least in part on determining that the temperature estimated at operation 1706 exceeds a threshold (e.g., a safety limit for the component).

As described above, reduction in power delivery at or around when the switches change state (i.e., being opened or closed) helps decrease or halt the temperature rise of the component. Furthermore, the temperature of the component may decrease such that it is below the safety limit/threshold. In such cases, at operation 1710, the method comprises increasing the power delivery from the generator for at least one time period around when switches in the solid-state impedance matching network are opening/closing. In some cases, operation 1710 may be performed when the temperature of the component (e.g., PIN diode) is below the threshold, the generator power is in a reduced state (e.g., 820 and 822 in FIG. 8), or a combination thereof.

Similar to method 1600, in some embodiments, operations 1706, 1708, and 1710 may be repeated for as long as power is being delivered to the load.

Reducing power delivery is exemplified, though not limited by, the examples shown in FIGS. 8 and 9, where normal power delivery is exemplified, though not limited by, the example shown in FIG. 6. Although not illustrated, the methods 1600 and 1700 can be combined such that power is stopped or reduced depending on feedback. For instance, power may be reduced (1708 in FIG. 17) if a characteristic of feedback (e.g., PIN diode junction temperature) exceeds a threshold, and stopped if that feedback continues in the same direction and exceeds a second threshold greater than the first threshold. Or a hysteretic method can be implemented, where power is stopped when a first threshold is exceeded, but as the feedback returns toward the threshold, power may be raised slightly (e.g., 1708 in FIG. 17 and the scheme of FIG. 7 or 8), but not all the way. Only after the feedback falls below the threshold might power resume in full (e.g., block 1610 and the scheme of FIG. 6).

Figure 18:
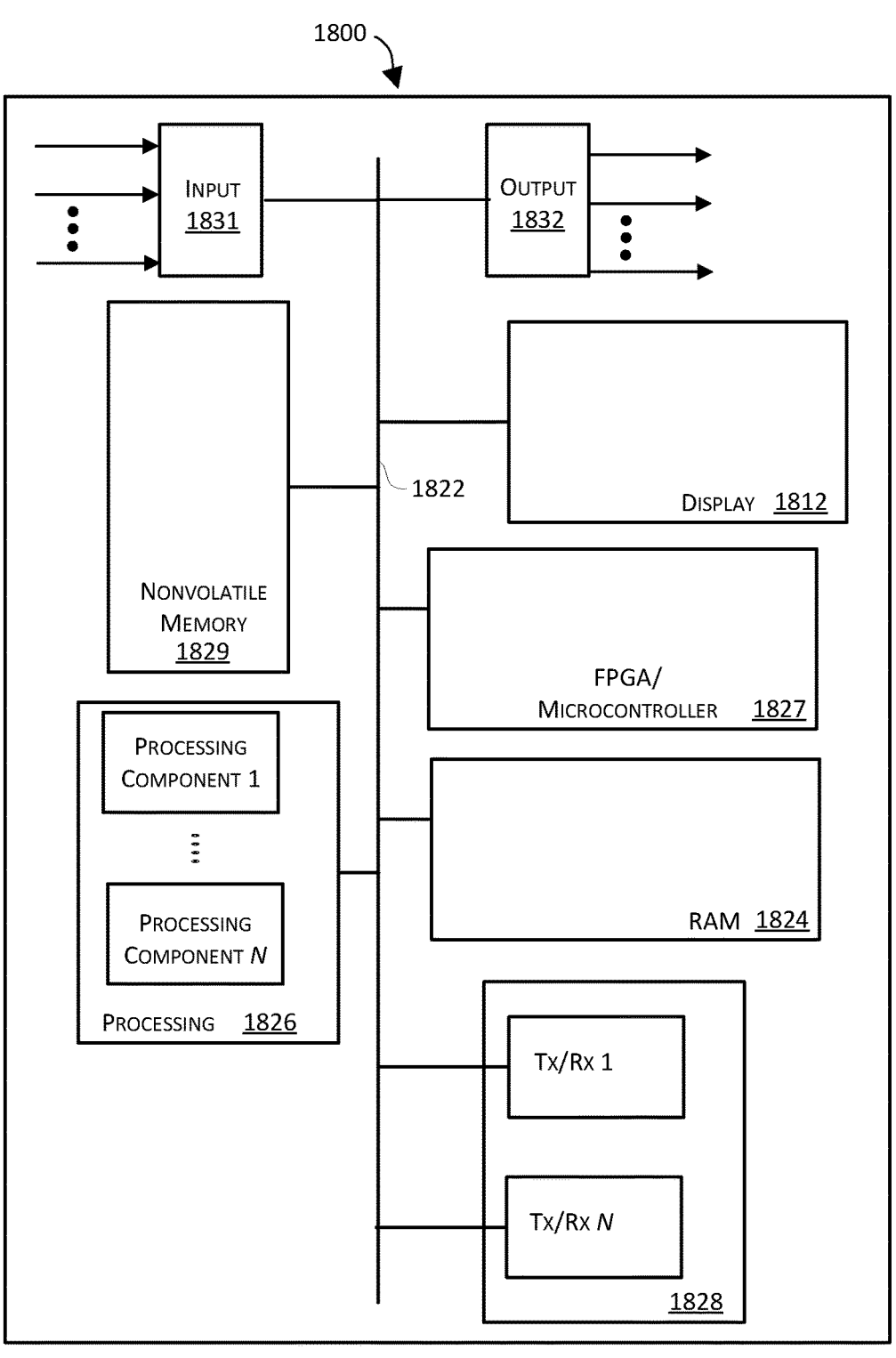
FIG. 18 illustrates a block diagram of a computer system that may be used to implement one or more aspects of the present disclosure.

FIG. 18 illustrates a block diagram of a computer system 1800 that may be used to implement one or more aspects of the present disclosure, including at least a method for synchronizing power delivery by a generator to a match network (e.g., described above in relation to FIGS. 14-17). As shown, in this embodiment a display 1812 and nonvolatile memory 1829 are coupled to a bus 1822 that is also coupled to random access memory ("RAM") 1824, a processing portion (which includes N processing components) 1826, a field programmable gate array (FPGA) 1827, and a transceiver component 1828 that includes N transceivers. Although the components depicted in FIG. 18 represent physical components, FIG. 18 is not intended to be a detailed hardware diagram; thus, many of the components depicted in FIG. 18 may be realized by common constructs or distributed among additional physical components. Moreover, other existing and yet-to-be developed physical components and architectures may also be utilized to implement the functional components described with reference to FIG. 18.

A display 1812 generally operates to provide a user interface for a user, and in several implementations, display 1812 is realized by a touchscreen display. For example, display 1812 can be used to control and interact with the components described herein. In general, nonvolatile memory 1829 is non-transitory memory that functions to store (e.g., persistently store) data and machine readable (e.g., processor executable) code (including executable code that is associated with effectuating the methods described herein). In some embodiments, for example, nonvolatile memory 1829 includes bootloader code, operating system code, file system code, and non-transitory processor-executable code to facilitate the execution of the methods described herein, such as method(s) 1400-1700 in FIGS. 14-17.

In some implementations, nonvolatile memory 1829 may be realized by flash memory (e.g., NAND or ONENAND memory). In other examples, other memory types may be utilized as well. Although some examples may execute the code from the nonvolatile memory 1829, in other examples, the executable code in the nonvolatile memory may typically be loaded into RAM 1824 and executed by one or more of the N processing components in the processing portion 1826.

In operation, the N processing components in connection with RAM 1824 may generally operate to execute the instructions stored in nonvolatile memory 1829 to realize the functionality of the power delivery system described herein, including at least the synchronization module (e.g., synchronization module 112, synchronization module 1012), the controller (e.g., controller 1020), and/or the generator (e.g., generator 102, generator 1002). For example, non-transitory processor-executable instructions to effectuate the methods described herein may be persistently stored in nonvolatile memory 1829 and executed by the N processing components in connection with RAM 1824. Processing portion 1826 may include a video processor, digital signal processor (DSP), graphics processing unit (GPU), and other processing components.

In addition, or in other examples, the field programmable gate array (FPGA) 1827 may be configured to effectuate one or more aspects of the methodologies described herein. For example, non-transitory FPGA-configuration-instructions may be persistently stored in nonvolatile memory 1829 and accessed by the FPGA 1827 (e.g., during boot up) to configure the FPGA 1827.

The input component 1831 may generally operate to receive signals (e.g., user input 1040, measured data 1038, feedback information 1044, timing information 1046, to name a few). Furthermore, the output component 1832 may generally operate to provide one or more digital and/or analog signals (e.g., communication 1034 specific to amplitude control, communication 1036 specific to timing control, control signal 1042 input to power amplifier, to name a few) to effectuate operational aspects of the power delivery system, and/or other systems described herein. In some embodiments, the computer system 1800 may be configured to perform a method for operating a power delivery system, including at least synchronizing the power delivered from a generator with the opening and closing of switches in a solid-state impedance matching network, as described above in relation to at least FIGS. 1-2, 7-8, 10, and 14-17.

The depicted transceiver component 1828 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

Methods 1400-1700 and other methods of this disclosure may include other steps or variations in various other embodiments. Some or all of any of method(s) 1400-1700 may be performed by or embodied in hardware, and/or performed or executed by a controller, a CPU, an FPGA, a System on Chip (SoC), a Measurement and Control Multi-Processor System on Chip (MPSoC), which may include both a CPU and an FPGA, and other elements together in one integrated SoC, or other processing device or computing device processing executable instructions, in controlling other associated hardware, devices, systems, or products in executing, implementing, or embodying various subject matter of the method Additional Embodiments Some aspects of the present disclosure may be characterized by as a method for operating a power delivery system, the method comprising: connecting a generator to a solid-state matching network, delivering power to the solid-state matching network with the generator, and synchronizing the power with the opening and closing of switches in the solid-state impedance matching network.

In some implementations of the method described above, power delivered by the generator to the solid-state matching network is stopped for a time period around the opening and closing of switches in the solid-state matching network.

In some implementations of the method described above, power delivered by the generator to the solid-state matching network is reduced for a time around the opening and closing of switches in the solid-state matching network.

In some implementations of the method described above, power delivered by the generator to the solid-state matching network is reduced for a time period around the opening and closing of switches in the solid-state matching network.

In some implementations, the method further comprises estimating a temperature of a device (e.g., a switch) in the solid-state match network and stopping the power delivered by the generator to the solid-state matching network for a time period around the opening and closing of switches in the solid-state matching network when the temperature is above an upper threshold (e.g., safety threshold).

In some implementations, the method further comprises resuming the power delivered by the generator to the match network for a time period around the opening and closing of switches in the solid-state matching network when the temperature is below the upper or safety threshold.

In some implementations, the method further comprises estimating a temperature of a device, such as a switch, in the solid-state matching network and reducing the power delivered by the generator to the solid-state matching network for a time period around the opening and closing of switches in the solid-state matching network when the temperature is above a threshold (e.g., upper or safety threshold for safe operation of the switch, such as, a PIN diode switch).

In some implementations, the method further comprises increasing the power delivered by the generator to the match network for a time period around the opening and closing of switches in the solid-state matching network when the temperature is below the safety threshold and the power output from the generator is currently reduced.

In some implementations, the method further comprises connecting the solid-state matching network to a load (e.g., a non-linear load such as a plasma load).

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (e.g., rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups but do not preclude the presence or addition of one or more other features, integers, steps, operations, elements, components, and/or groups thereof. As used herein, the term "and/or" includes any and all combinations of one or more of the associated listed items and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

What is claimed is:
1. A synchronization module, comprising:
one or more hardware processors configured by machine-readable instructions to:
identify a first control source, wherein the first control source outputs at least one first control signal;

25

26 identify a second control source, wherein the second control source outputs at least one second control signal;

obtain timing information from a solid-state match network, wherein the solid-state match network comprises one or more switches, and wherein the timing information comprises information pertaining to time periods when the one or more switches change state;

determine, based at least in part on the timing information, to synchronize power delivered from a generator with the opening and closing of the one or more switches in the solid-state match network, two or more of:

a first time period where the first control source is active;

a second time period where the second control source is active; and a time for switching from the first to the second control source or vice-versa.

2. The synchronization module of claim 1, wherein the one or more hardware processors are further configured by machine-readable instructions to:

receive feedback information related to data measured during one or more of the first time period and the second time period; and adjust, based at least in part on the feedback information, one or more of the at least one first control signal and the at least one second control signal.

3. The synchronization module of claim 1, wherein the synchronization module is electronically, logically, or communicatively coupled to the generator and the solid-state match network, the generator comprising:

a power amplifier, the power amplifier configured to receive the at least one first control signal from the first control source and the at least one second control signal from the second control source; and at least one switch.

4. The synchronization module of claim 3, wherein the one or more hardware processors are further configured by machine-readable instructions to:

control the at least one switch in the generator, wherein controlling the at least one switch in the generator comprises:

coupling the power amplifier to the first control source during the first time period; transitioning control of the power amplifier from the first control source to the second control source; and coupling the power amplifier to the second control source during the second time period.

5. The synchronization module of claim 4, wherein the one or more hardware processors are further configured by machine-readable instructions to:

transmit an indication to the power amplifier to one of pause, reduce, or increase power output for each of the one or more time periods when the one or more switches of the solid-state match network change state, and wherein the indication is received via one of the first control signal and the second control signal.

6. The synchronization module of claim 5, wherein the one or more hardware processors are further configured by machine-readable instructions to:

receive feedback information related to a power level measured during at least one duration when the power output from the power amplifier is paused, reduced, or increased; and adjust, based at least in part on the feedback information, one or more of the at least one first control signal, the at least one second control signal, the first time period, and the second time period.

7. A synchronization module, comprising:

at least one processor; and memory comprising non-transitory processor-readable instructions that are executable by the at least one processor to:

identify a first control source;

identify a second control source;

obtain timing information from a match network, wherein the timing information comprises information for time periods when one or more switches of the match network change state; and determine, based at least in part on the timing information, to synchronize power delivered from a generator with the opening and closing of one or more switches in the match network, two or more of:

a first time period where the first control source is active;

a second time period where the second control source is active; and a time for switching from the first to the second control source.

8. The synchronization module of claim 7, wherein the instructions comprise instructions to:

receive feedback information related to data measured during one or more of the first time period and the second time period; and adjust, based at least in part on the feedback information, at least one of a first control signal output by the first control source and a second control signal output by the second control source.

9. The synchronization module of claim 7, wherein the synchronization module comprises circuitry to communicatively couple to the generator and the match network.

10. The synchronization module of claim 9, wherein the instructions comprise instructions to:

control at least one switch in the generator, wherein controlling the at least one switch in the generator comprises:

coupling a power amplifier of the generator to the first control source during the first time period;

transitioning control of the power amplifier from the first control source to the second control source; and coupling the power amplifier to the second control source during the second time period.

11. The synchronization module of claim 10, wherein the instructions comprise instructions to:

transmit an indication to the power amplifier to one of pause, reduce, or increase power output for each of the one or more time periods when the one or more switches of the solid-state match network change state, and wherein the indication is received via one of the first control signal and the second control signal.

12. The synchronization module of claim 11, wherein the instructions comprise instructions to:

receive feedback information related to a power level measured during at least one duration when the power output from the power amplifier is paused, reduced, or increased; and adjust, based at least in part on the feedback information, at least one of the first control signal, the second control signal, the first time period, and the second time period.

* * * * *